United States Patent
Owei et al.

(10) Patent No.: US 9,338,896 B2
(45) Date of Patent: May 10, 2016

(54) ADHESION PROMOTION IN PRINTED CIRCUIT BOARDS

(75) Inventors: Abayomi I. Owei, Rancho Cucamonga, CA (US); Joseph A. Abys, Guilford, CT (US); Theodore Antonellis, Bethany, CT (US); Eric Walch, Solingen (DE)

(73) Assignee: ENTHONE, INC., West Haven, CT (US)

( * ) Notice: Subject to any disclaimer, the term of this patent is extended or adjusted under 35 U.S.C. 154(b) by 92 days.

(21) Appl. No.: 13/558,019

(22) Filed: Jul. 25, 2012

(65) Prior Publication Data

US 2014/0030425 A1    Jan. 30, 2014

(51) Int. Cl.
| | |
|---|---|
| *B05D 5/10* | (2006.01) |
| *H05K 3/38* | (2006.01) |
| *C23C 22/52* | (2006.01) |
| *C23C 22/63* | (2006.01) |
| *C23C 22/73* | (2006.01) |
| *C23C 22/78* | (2006.01) |
| *B05D 3/10* | (2006.01) |
| *C23F 1/18* | (2006.01) |
| *C23G 1/20* | (2006.01) |

(52) U.S. Cl.
CPC ........ *H05K 3/383* (2013.01); *B05D 5/10* (2013.01); *C23C 22/52* (2013.01); *C23C 22/63* (2013.01); *C23C 22/73* (2013.01); *C23C 22/78* (2013.01); *B05D 3/10* (2013.01); *C23F 1/18* (2013.01); *C23G 1/20* (2013.01)

(58) Field of Classification Search
USPC ....................... 427/97.8, 98.6, 299
See application file for complete search history.

(56) References Cited

U.S. PATENT DOCUMENTS

| | | | |
|---|---|---|---|
| 5,800,859 A | 9/1998 | Price et al. | |
| 6,127,282 A * | 10/2000 | Lopatin | 438/754 |
| 6,261,466 B1 * | 7/2001 | Bayes et al. | 216/13 |
| 6,521,139 B1 * | 2/2003 | Kondo et al. | 216/108 |
| 6,562,149 B1 * | 5/2003 | Grieser et al. | 148/270 |

(Continued)

FOREIGN PATENT DOCUMENTS

| | | |
|---|---|---|
| EP | 2274460 B1 | 10/2012 |
| WO | 96/19097 | 6/1996 |

(Continued)

OTHER PUBLICATIONS

Song, S.M. et al., Adhesion improvement of epoxy resin/copper lead frame joints by azole compounds, J. Adhesion Sci. Technol., vol. 12, No. 5, pp. 541-561 (1998).

(Continued)

*Primary Examiner* — Brian K Talbot
(74) *Attorney, Agent, or Firm* — Carmody Torrance Sandak & Hennessey LLP

(57) ABSTRACT

Compositions and methods for enhancing adhesion between a copper conducting layer and a dielectric material during manufacture of a printed circuit board. Conditioning compositions contain a functional organic compound and preferably a transition metal ion. The functional organic compound, e.g., a purine derivative, is capable of forming a self-assembled monolayer. Adhesion promoting compositions contain an acid, preferably an inorganic acid, and an oxidant. The latter compositions may also contain a corrosion inhibitor and/or a transition metal ion selected from among Zn, Ni, Co, Cu, Ag, Au, Pd or another Pt group metal. The corrosion inhibitor may comprise a nitrogen-containing aromatic heterocyclic compound.

40 Claims, 16 Drawing Sheets

(56) References Cited

U.S. PATENT DOCUMENTS

| | | |
|---|---|---|
| 6,602,440 B2 * | 8/2003 | Bishop et al. ............... 252/79.1 |
| 6,723,385 B1 * | 4/2004 | Grieser et al. ............... 427/307 |
| 6,852,427 B1 | 2/2005 | Howell et al. |
| 7,232,478 B2 * | 6/2007 | Owei et al. ............... 106/14.41 |
| 2001/0015345 A1 | 8/2001 | Emami et al. |
| 2002/0048677 A1 * | 4/2002 | Hanneman et al. ........ 428/411.1 |
| 2004/0048486 A1 | 3/2004 | Bernards et al. |
| 2005/0067378 A1 | 3/2005 | Fuerhaupter et al. |
| 2005/0126429 A1 | 6/2005 | Bernards et al. |
| 2009/0297981 A1 | 12/2009 | Itagaki et al. |
| 2012/0125514 A1 * | 5/2012 | Wei et al. ........................ 156/60 |
| 2012/0168075 A1 | 7/2012 | Abys et al. |

FOREIGN PATENT DOCUMENTS

| | | |
|---|---|---|
| WO | 03/029227 A1 | 4/2003 |
| WO | WO 2009/117734 * | 9/2009 |

OTHER PUBLICATIONS

Song, S.M. et al., Synthesis and Characterization of Water-Soluble Polymeric Adhesion Promoter for Epoxy Resin/Copper Joints, Journal of Applied Polymer Science, vol. 85, No. 10, Sep. 6, 2002, pp. 2202-2210.

Tompkins, H.G. et al., The Interaction of Imidazole, Benzimidazole Related Azoles with a Copper Surface, Surface and Interface Analysis, vol. 4, No. 6, Dec. 1982, pp. 261-266.

International Search Report regarding PCT/US2009/037969 dated May 20, 2009, 4 pages.

International Search Report, PCT/US2013/055368, dated May 28, 2014, 4 pages.

Written Opinion, PCT/US2013/055368, dated May 28, 2014, 4 pages.

* cited by examiner

ADHESION PROMOTION IN PRINTED CIRCUIT BOARDS

FIELD OF THE INVENTION

This invention relates to improving adhesion of metal surfaces, such as copper to an insulating layer, in the manufacture of printed circuit boards.

BACKGROUND OF THE INVENTION

A multilayer circuit board (MLB) has, among other things, a number of metal layers defining circuit patterns, and a number of insulating layers there-between. The metal layers defining circuit patterns today are typically formed from copper, and the insulating layers are typically formed from a resinous fiber-impregnated dielectric material. These respective layers can have a wide variety of thickness. For example, they can be on the order of only microns thick, or much thicker.

In manufacturing MLBs, it is desirable to enhance the adhesion between the conducting and insulating layers to avoid delamination in subsequent manufacturing operations or in service. So called "black oxide" processes had been used for years which created a strongly adherent copper oxide layer to which an insulating layer would adhere better. Black oxide processes have, for most of the industry, been replaced by processes such as described in U.S. Pat. No. 5,800,859 involving formation of an organometallic conversion coating (OMCC). These organometallic conversion coating processes involve exposing the copper circuit layer to an adhesion promotion solution, which contains various components including an oxidizer, an inhibitor, and a mineral acid.

One limitation on organometallic conversion coating processes has been that the organometallic conversion coating must be a uniform color, such as, for example, a dark brown or chocolate color. The industry associates this color with a uniform coating which has strong adhesion properties. A dark uniform color is preferred because it provides color contrast with copper to aid in inspection for defects. For example, it provides contrast for inspection for the so-called "pink-ring" defect. Organometallic conversion coating processes which produce significantly lighter coatings are generally unacceptable, or at least undesirable for most applications. For a lighter coating, "pink ring" defects are substantially more difficult to detect.

SUMMARY OF THE INVENTION

Briefly, therefore, the application is directed to a method for enhancing adhesion between a copper conducting layer and a dielectric material during manufacture of a printed circuit board, the method comprising contacting the copper conducting layer with a conditioning composition, said conditioning composition comprising a functional organic compound and a transition metal ion, said functional organic compound being capable of forming a self-assembled monolayer on a copper surface, and thereafter contacting the copper conducting layer with an adhesion promoting composition that comprises an oxidizing agent, an inorganic acid, and a corrosion inhibitor.

In another aspect the invention is directed to a method for enhancing adhesion between a copper conducting layer and a dielectric material during manufacture of a printed circuit board, the method comprising contacting the copper conducting layer with a conditioning composition comprising an organic N-bearing compound capable of forming a self-assembled monolayer on a copper surface, and thereafter contacting the copper conducting layer with an adhesion promoting composition that comprises an oxidizing agent, an inorganic acid, a corrosion inhibitor and a transition metal ion selected from the group consisting of zinc, nickel, cobalt, copper, silver, gold, palladium and other platinum group metals, said corrosion inhibitor comprising an aromatic heterocyclic compound comprising nitrogen.

The invention is further directed to an aqueous alkaline composition comprising a nitrogen-containing aromatic heterocyclic compound and a transition metal ion, said heterocyclic compound comprising a ring

group or an amine substitutent on the ring wherein R7 is hydrogen, hydrocarbyl, substituted hydrocarbyl, hydroxyl, or a negative charge, said heterocyclic compound being capable of forming a self-assembled monolayer on a copper surface.

The invention is also directed to an aqueous composition for treating a copper surface to enhance adhesion to a dielectric, the composition comprising between about 0.02 and about 2 wt. % transition metal ion selected from the group consisting of zinc, nickel, cobalt, copper, silver, gold, palladium and other platinum group metal, between about 10 and about 50 wt. % sulfuric acid, between about 1 and about 10 wt. % hydrogen peroxide, and a corrosion inhibitor comprising a nitrogen-containing aromatic heterocyclic compound.

In another aspect, the invention is directed to method for enhancing adhesion between a copper conducting layer and a dielectric material during manufacture of a printed circuit board. The method comprises contacting the copper conducting layer with a conditioning composition comprising a nitrogen-containing aromatic heterocyclic compound that is capable of forming a self-assembled monolayer on a copper surface. The nitrogen-containing aromatic heterocyclic compound corresponds to the formula:

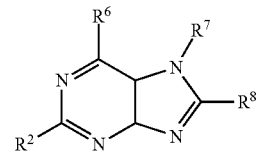

(Formula I)

wherein each of $R^2$, $R^6$, and $R^8$ is independently selected from the group consisting of hydrogen, hydrocarbyl, substituted hydrocarbyl, hydroxycarbonyl, alkoxycarbonyl, alkoxy, hydroxyl, sulfhydryl, halo, nitro, cyano and $NR^9R^{10}$, $R^7$ is selected from the group consisting of hydrogen, hydrocarbyl, substituted hydrocarbyl, hydroxyl, or a negative charge, and each of $R^9$ and $R^{10}$ is independently selected from the group consisting of hydrogen, hydrocarbyl and substituted hydrocarbyl. Thereafter the copper conducting layer is contacted with an adhesion promoting composition that comprises an oxidizing agent, an inorganic acid, a corrosion inhibitor, and a surfactant.

The invention is still further directed to method for preparing a copper conducting layer for adhesion to a dielectric material during manufacture of a printed circuit board. The method comprises contacting the copper conducting layer with a conditioning composition comprising a nitrogen-containing aromatic heterocyclic compound and an anionic surfactant. The nitrogen-containing aromatic heterocyclic compound is capable of forming a self-assembled monolayer on a copper surface and comprises a ring

group or an amine substitutent on the ring wherein $R^7$ is hydrogen, hydrocarbyl, substituted hydrocarbyl, hydroxyl, or a negative charge. Thereafter the copper conducting layer is contacted with an adhesive promoting composition that comprises an acid and an oxidant.

The invention is also directed to a method for preparing a copper conducting layer for adhesion to a dielectric material during manufacture of a printed circuit board. The method comprises contacting the copper conducting layer with a conditioning composition comprising a nitrogen-containing aromatic heterocyclic compound, an alkali metal iodide and a glycol ether. The nitrogen containing heterocyclic compound is capable of forming a self-assembled monolayer on a copper surface, and comprises a ring

group or an amine substitutent on the ring wherein $R^7$ is hydrogen, hydrocarbyl, substituted hydrocarbyl, hydroxyl, or a negative charge.

Other aspects and features will be in part apparent and in part pointed out hereinafter.

Figure 7:
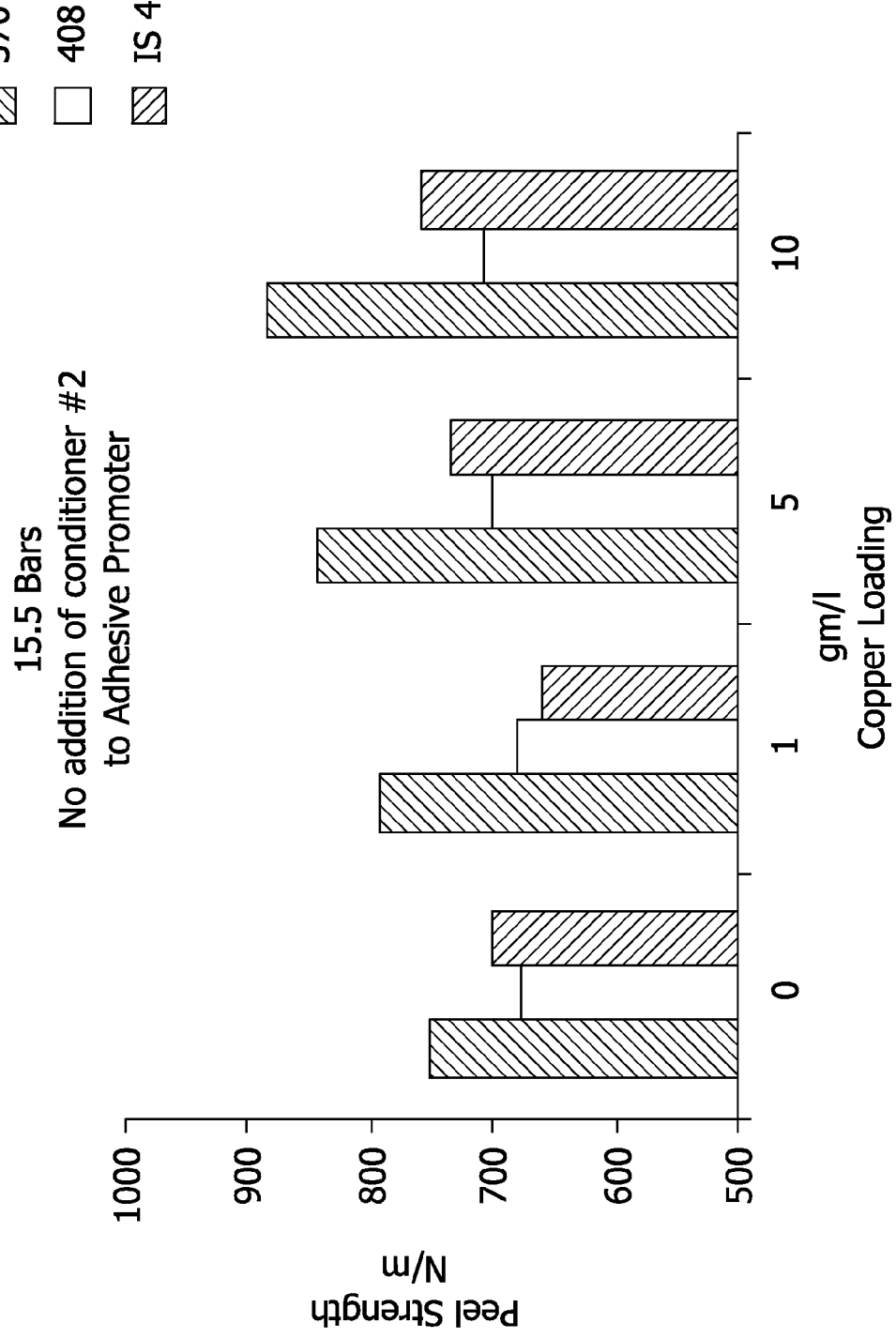
Figure 8:
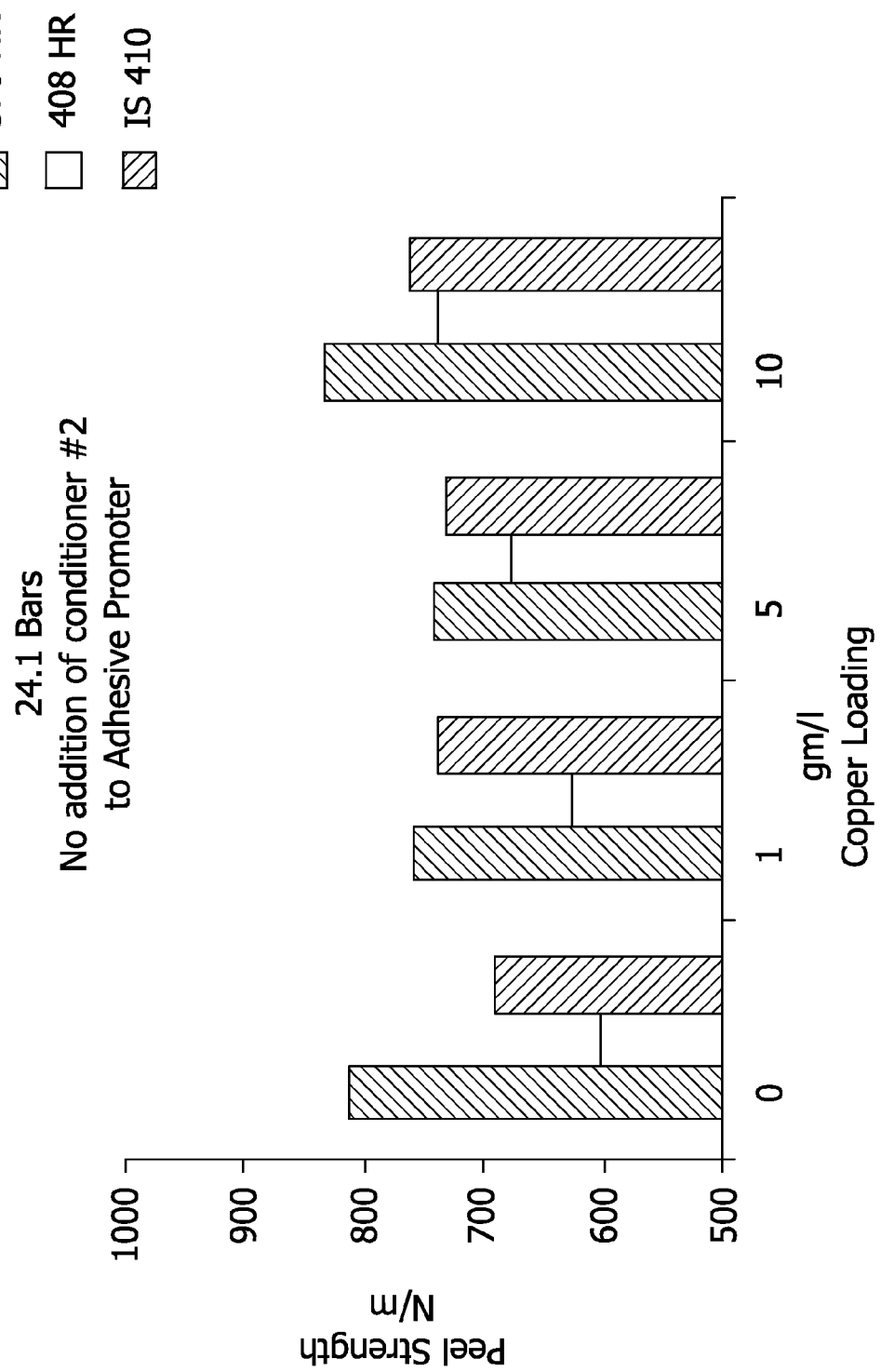
Figure 9:
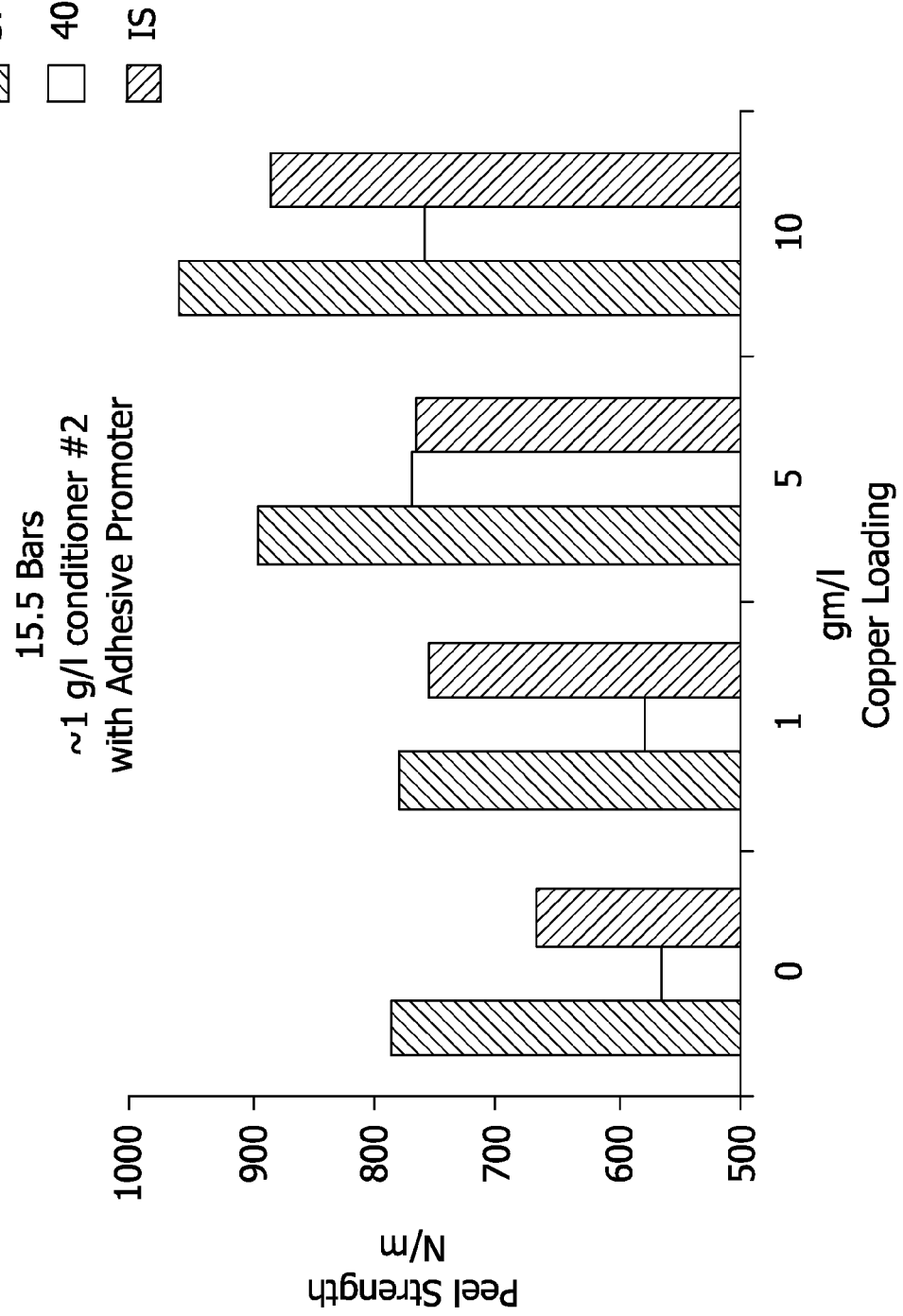
Figure 10:
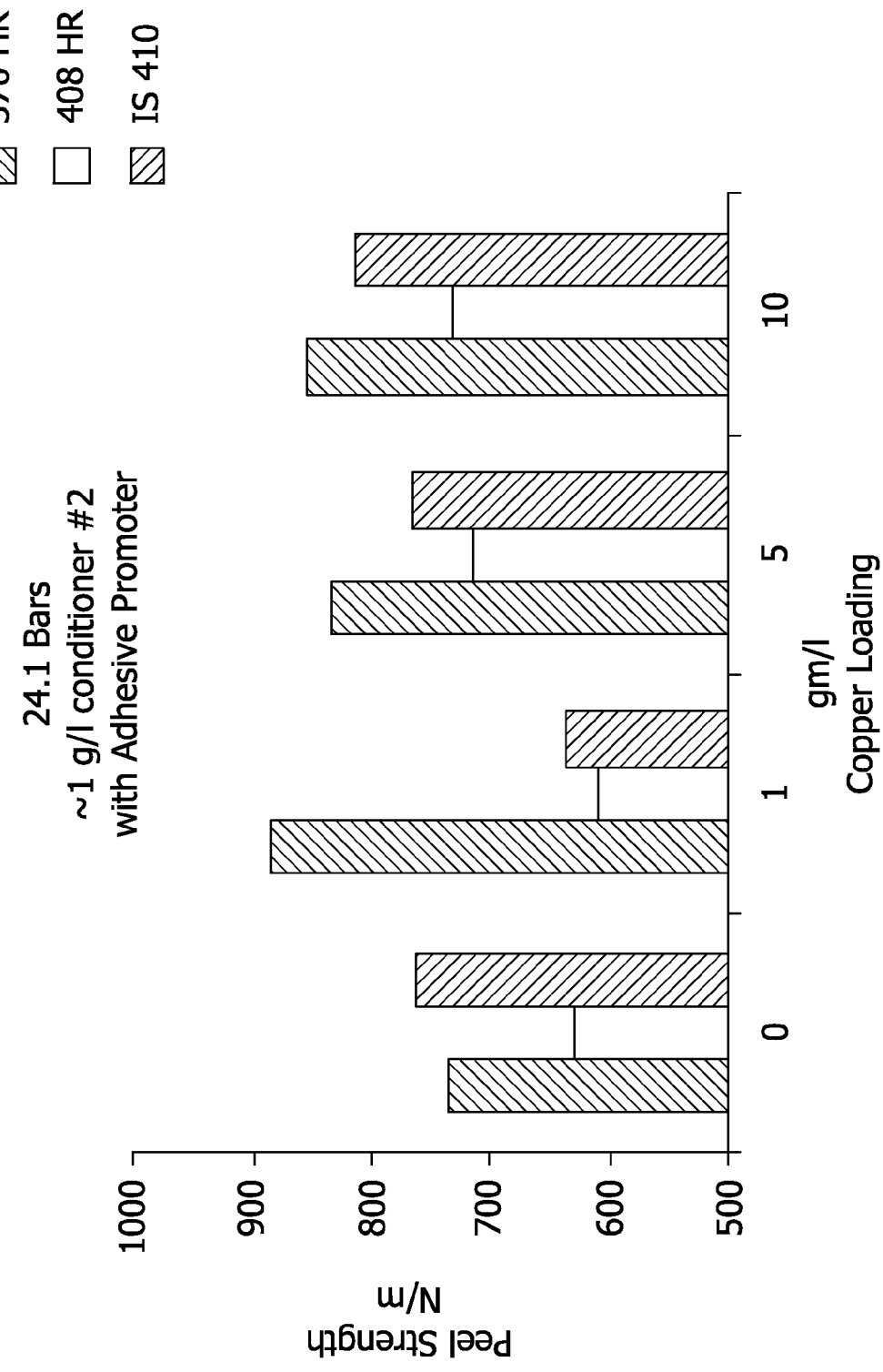
Figure 11:
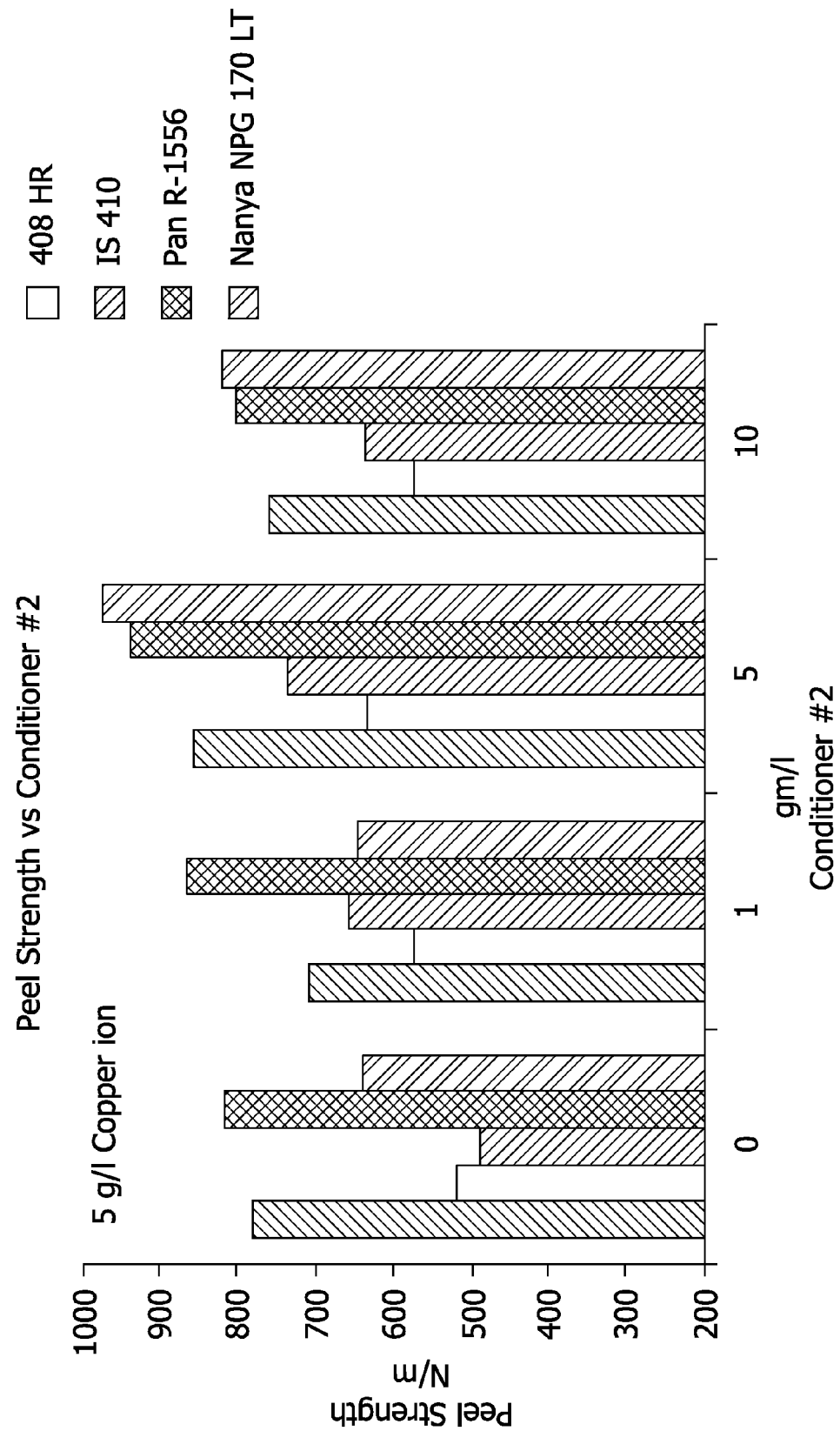
Figure 12:
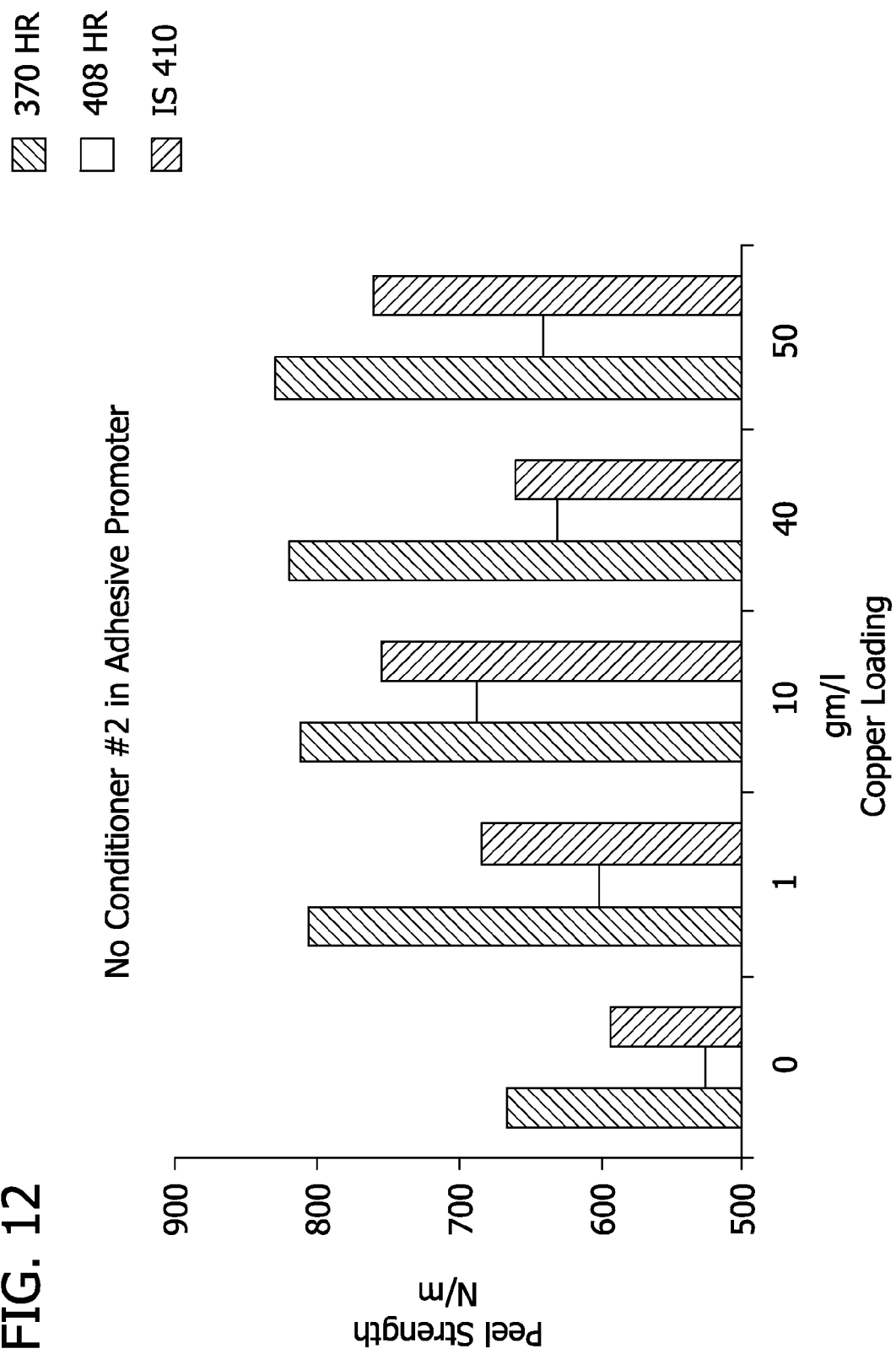
Figure 13:
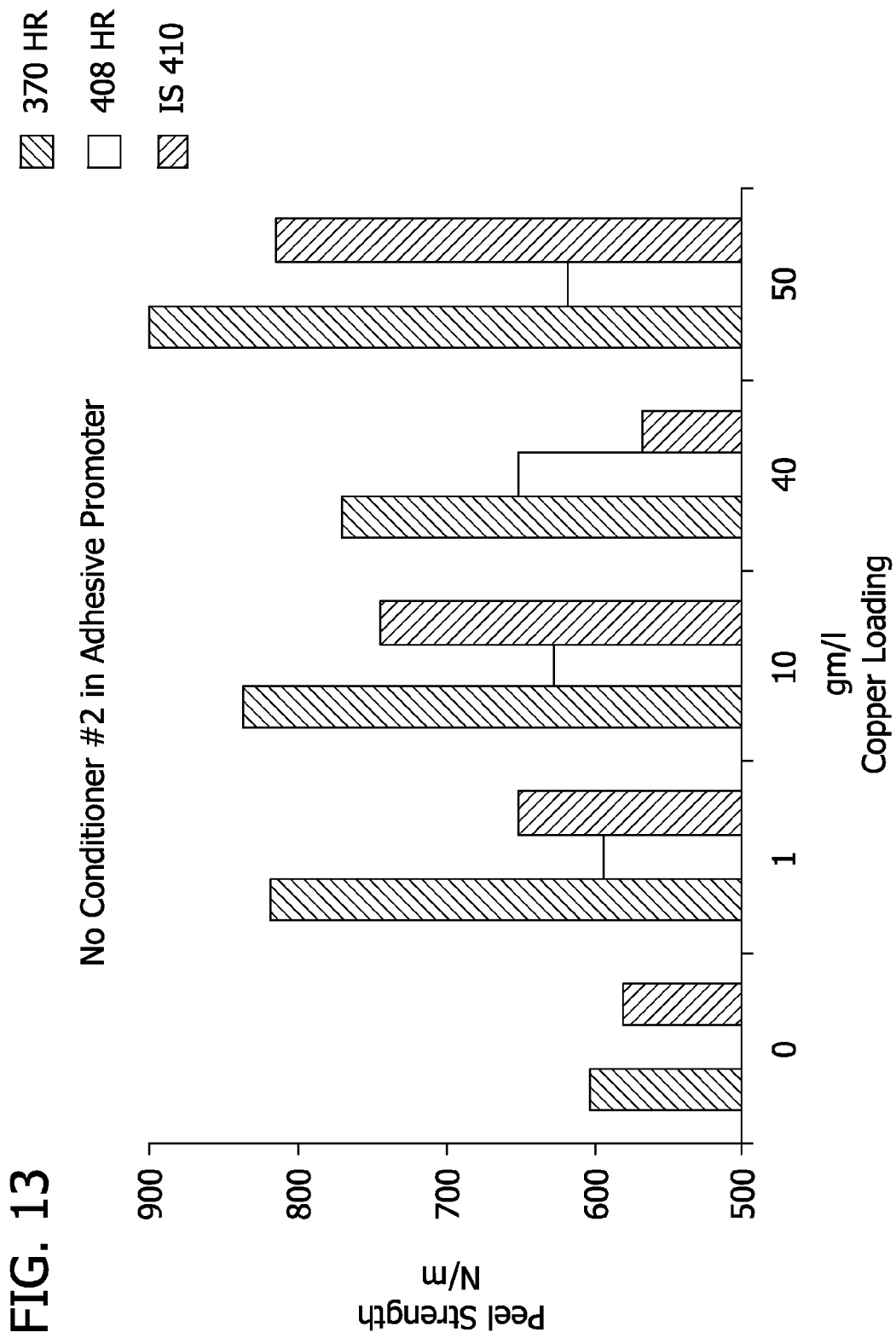
Figure 14:
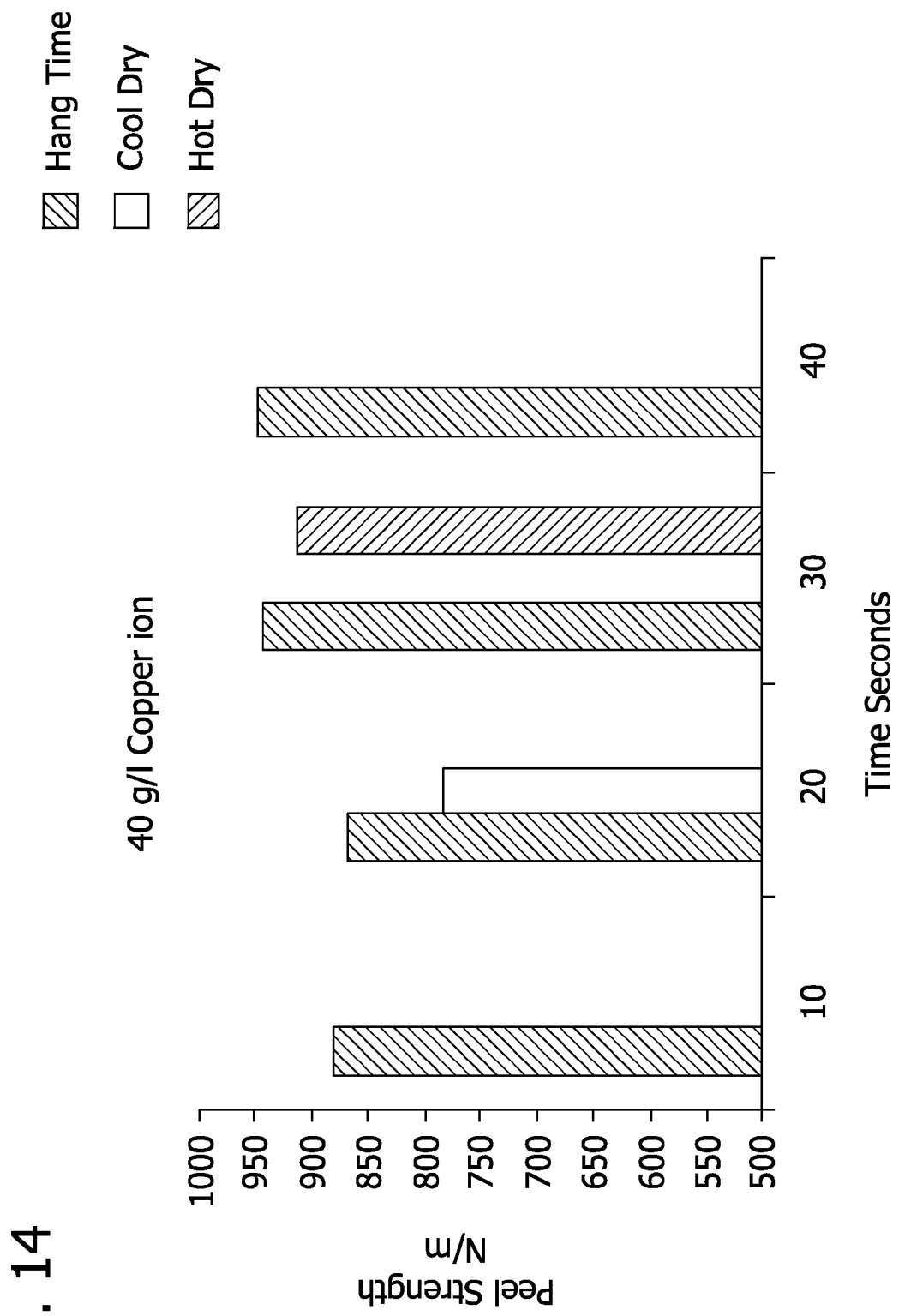
Figure 15:
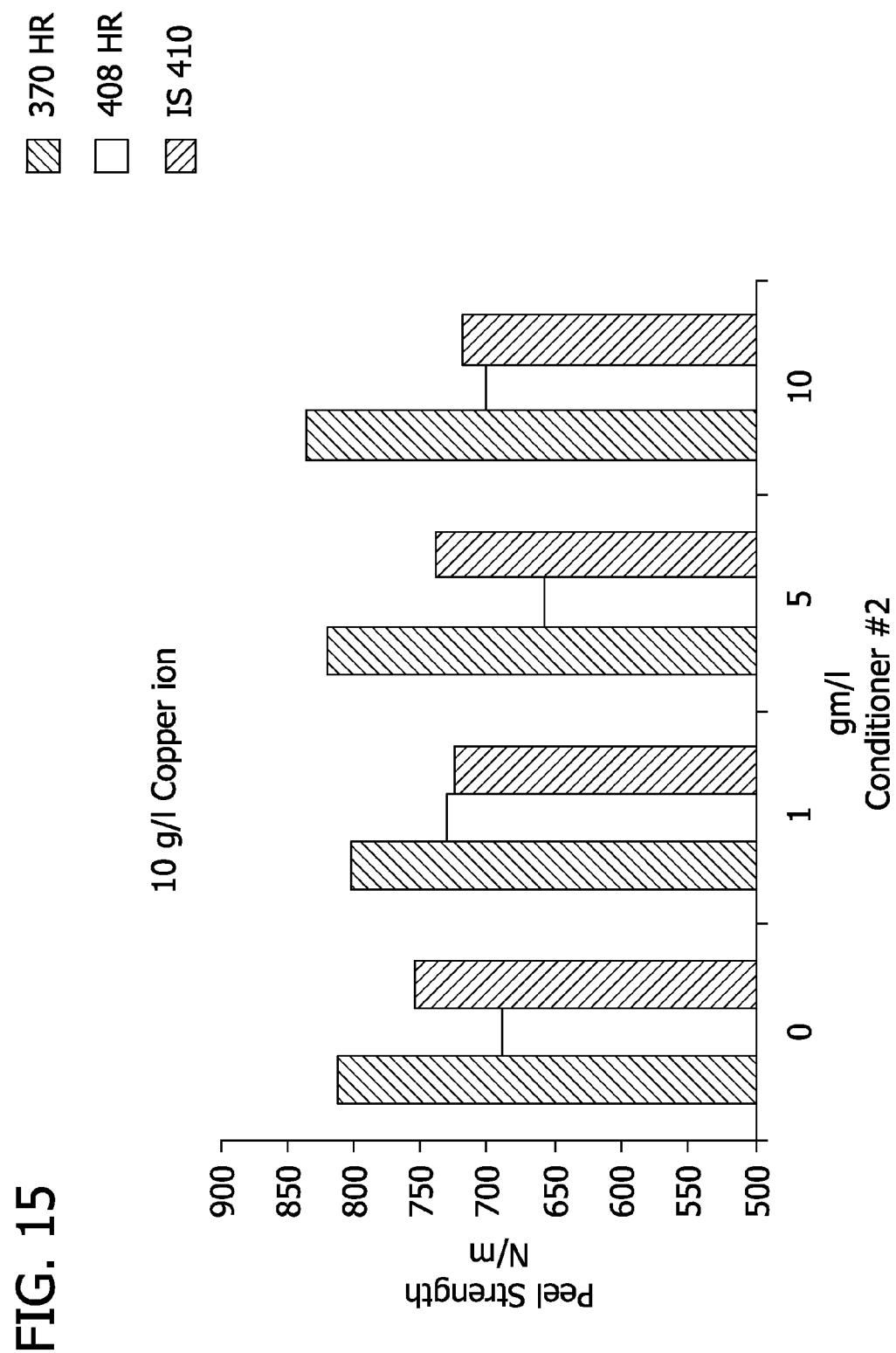
Figure 16:
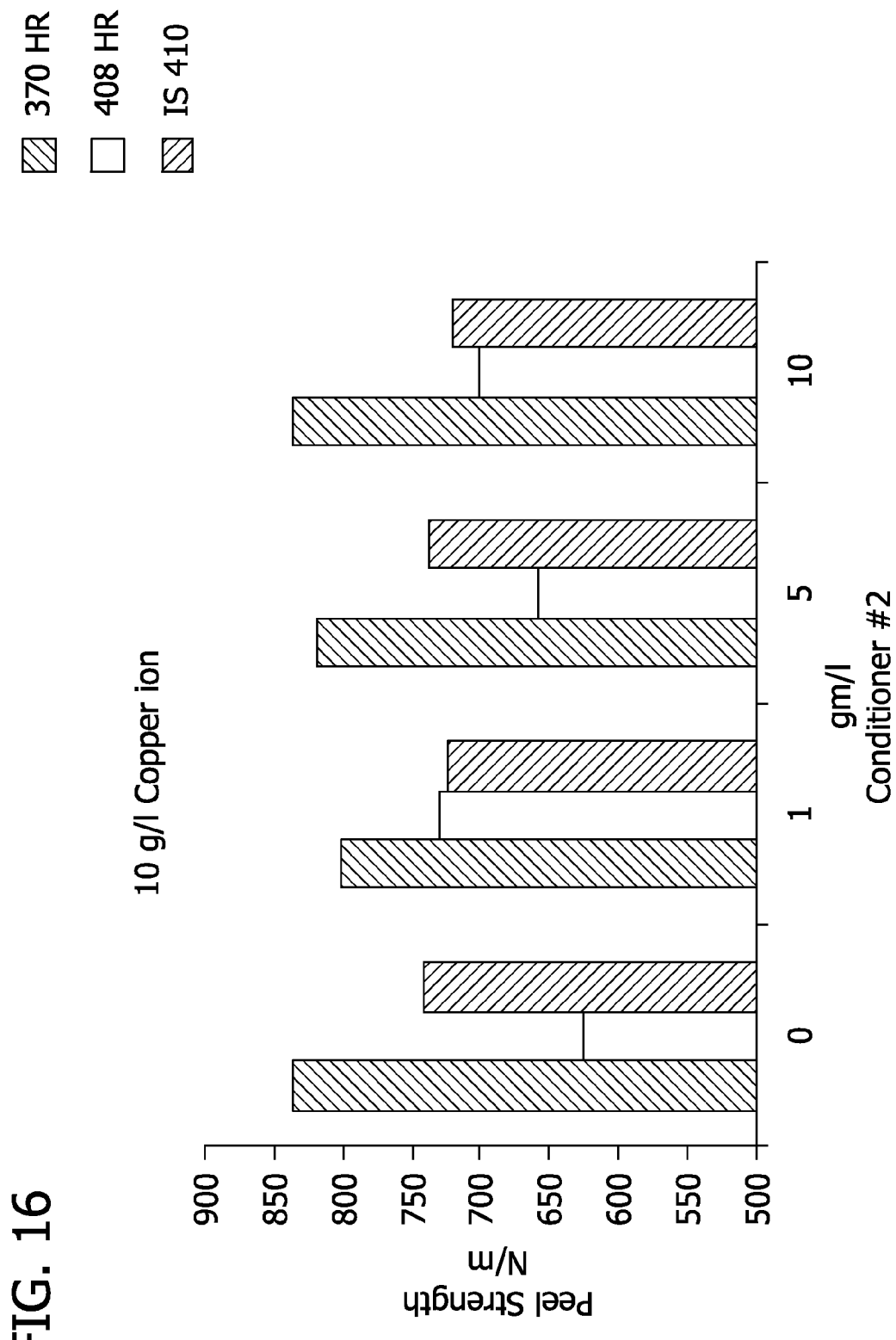

Each of FIGS. 3 to 6 is a series of bar graphs showing peel strength as a function of copper loading for laminates prepared after treatment with a conditioner and adhesion promoter at two different laminating pressures (24.1 bars or 15.5 bars) and both before and after reflow, as further described in Example 19, wherein again each of the conditioner and adhesion promoter compositions contained a concentration of copper ion ranging from 0 to 10 g/l;

Each of FIGS. 7 and 8 is a series of bar graphs showing peel strength as a function of copper loading for laminates prepared at 15.5 bars and 24.1 bars, respectively, after treatment with a conditioner and adhesion promoter as described in Example 20, wherein each of the conditioner and adhesion promoting composition had a copper ion content ranging from 0 to 10 g/l and the adhesion promoting composition had not been doped with the conditioner;

Each of FIGS. 9 and 10 is a series of bar graphs showing peel strength as a function of copper loading for laminates prepared at 15.5 and 24.1 bars, respectively, after treatment with a conditioner and adhesion promoter as described in Example 20, wherein each of the conditioner and adhesion promoting composition had a copper ion content ranging from 0 to 10 g/l and the adhesion promoting composition had been doped with ~1 g/l of conditioner #2;

FIG. 11 is a series of bar graphs showing peel strength as a function of conditioner #2 content in the adhesion promoting composition for laminates prepared according to Example 21 wherein each of the conditioner and adhesion promoting compositions had a copper ion content of approximately 5 g/l;

FIG. 12 is a series of bar graphs showing peel strength as a function of copper loading for laminates prepared according to Example 22 wherein the copper ion concentration ranged from 0 to 50 g/l and no Conditioner #2 was added to the adhesion promoting composition;

FIG. 13 is a series of bar graphs showing peel strength as a function of copper loading for laminates prepared according to Example 22 wherein the copper ion concentration ranged from 0 to 50 g/l and the adhesion promoting composition was doped with ~1 g/l Conditioner #2;

FIG. 14 is a series of bar graphs showing peel strength as a function of dwell time between application of the conditioner and application of the adhesion promoting composition for laminates prepared according to Example 23 wherein each conditioner and adhesion promoter was doped with 40 g/l copper ions;

Each of FIGS. 15 and 16 is a series of bar graphs showing peel strength as a function of conditioner #2 content in the adhesion promoting composition for laminates prepared according to Example 24 wherein each of the conditioner and adhesion promoting compositions had a copper ion content of approximately 10 g/l.

DETAILED DESCRIPTION OF
EMBODIMENT(S) OF THE INVENTION

The present invention is directed to compositions and methods for enhancing adhesion between a copper conducting layer and a non-conducting laminate. As a general proposition, the development of an adhesive organometallic conversion coating on the surface of the copper conducting layer occurs by contacting the copper conducting layer with an adhesion promotion composition that brings about the oxidation of copper on the surface of the conducting layer into cuprous ions and cupric ions. Cuprous ions ($Cu^+$) which are formed by the oxidation reaction generally dominate on the surface, and cupric ions ($Cu^{2+}$) generally dominate in solution. The cuprous ions on the surface bind with a corrosion inhibitor in the adhesion promotion composition and form a copper-inhibitor-complex as copper dissolves from the conducting copper layer into the adhesion promoter chemistry at the same time. This results in micro-roughened surface morphology of the conducting copper layer. This micro-roughened copper surface promotes adhesion with the subsequently applied insulating layer.

In the process of the present invention, prior to contacting the copper conducting layer with the adhesion promotion composition, the copper conducting layer is preferably contacted with a conditioning composition comprising a nitrogen-containing heterocycle that is capable of forming a self-assembled monolayer (SAM) on a copper surface. It has been discovered that the molecule capable of forming a SAM may be incorporated into the alkaline cleaner or it may be used in a separate pre-dip composition. The self-assembled monolayer essentially consists of a densely packed organic film formed of a monolayer of the nitrogen-containing heterocycle molecule or other film-forming organic nitrogen or sulfur compound chemisorbed to the copper surface. Without being bound to a particular theory, it is believed that the self assembled monolayer formed over the copper surface from the conditioning solution functions to passivate the copper surface by blocking access of oxygen contained in the adhesion promoting composition. It thus modulates the effect of the subsequently applied adhesion promotion solution by preventing excess copper oxide formation that may otherwise result from the aggressive effect of the peroxide component of the latter solution.

In addition to the nitrogen-containing heterocycle, the conditioning composition preferably contains a transition metal ion, typically in the form of a transition metal salt. Useful transition metal ions include zinc, nickel, copper, cobalt, silver, gold, palladium and other platinum group metals. Preferably, the transition metal ion is selected from the group consisting of zinc, nickel, cobalt, silver, gold, palladium and other platinum group metals, more preferably zinc, nickel, cobalt or silver, still more preferably zinc, nickel or cobalt. Zinc is preferred. Various salts of the transition metal can be used, including sulfates, chlorides, other halides, most prominently iodides, phosphates, phosphides, carbonates, and various carboxylates, including, e.g., oxalates. Oxides may also be used. It is believed that the presence of these transition metal ions in the conditioning solution contributes to the heat stability of the conversion coating produced in the subsequent treatment with the adhesion promoting solution. In a preferred embodiment of the invention, zinc is incorporated into the conditioning solution in the form of an alkaline dispersion of ZnO, a solution of alkali metal zincate, or a zinc ammonium halide such as zinc ammonium chloride.

Preferably, the nitrogen-containing heterocycle is a purine compound, for example, a compound that corresponds to the formula:

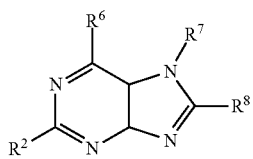

(Formula I)

wherein each of $R^2$, $R^6$, and $R^8$ is independently selected from the group consisting of hydrogen, hydrocarbyl, substituted hydrocarbyl, hydroxycarbonyl, alkoxycarbonyl, alkoxy, hydroxyl, sulfhydryl, halo, nitro, cyano and $NR^9R^{10}$, $R^7$ is selected from the group consisting of hydrogen, hydrocarbyl, substituted hydrocarbyl, hydroxyl, or a negative charge, and each of $R^9$ and $R^{10}$ is independently selected from the group consisting of hydrogen, hydrocarbyl and substituted hydrocarbyl. Preferably, each of $R^9$ and $R^{10}$ is independently selected from the group consisting of hydrogen, alkyl, substituted alkyl, aralkyl and aryl.

In particularly preferred embodiments, $R^6$ of Formula I comprises $NR^9R^{10}$. Where the hydrocarbyl substituent is substituted, the substituent on the hydrocarbyl is preferably amino, cyano, nitro, halo, hydroxy or sulfhydryl. Most preferably, $R^9$ is hydrogen and $R^{10}$ is benzyl, i.e., the compound forming the self-assembling monolayer is most preferably an amino substituted purine such as 6-benzylaminopurine:

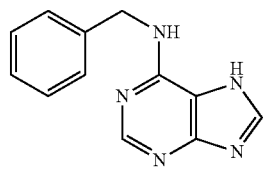 [SMILES: c1ccc(CNc2ncnc3nc[nH]c23)cc1]

However, the compound of Formula I can also advantageously comprise unsubstituted purine. In the preferably alkaline conditioner solution, $R^7$ is preferably hydrogen and said nitrogen-containing aromatic heterocyclic compound is deprotonatable in contact with a copper substrate. Thus, in the solution, and especially in contact with a copper substrate, $R^7$ comprises hydroxyl or a negative charge.

The

group in the purine ring enables an efficient interaction towards the metal surface (copper). The presence of the ring

group and/or other

group ($R_7$ being benzyl in the case of 6-benzylaminopurine) substituent on the ring allows the formation of coordinate bonds at the metal and purine compound interface.

Purine derivatives in the conditioning solution have been found to contribute to bond strength between copper conductor and resin after treatment of the conditioned surface with the adhesion promoting composition and subsequent lamination. Purine derivatives have further been found to contribute to the thermal stability of the conversion coating produced by subsequent treatment with the adhesion promoting solution.

Although purines and especially amine substituted purines are especially preferred, other nitrogen heterocycles comprising a ring

group and/or an amino substituent on the ring can serve effectively for formation of a self-assembled monolayer from the conditioning solution onto the copper surface. Illustrative heterocycles that function effectively for this purpose include benzotriazole:

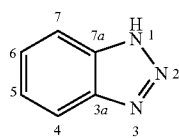

Benzo-triazole (BTA)

and various substituted benzotriazoles, as well as substituted and unsubstituted triazoles, tetrazoles, benzimidazoles, etc. In addition to amines, the heterocycle may comprise a functional ring substituent such as thiol, vinyl ether, thiamide, amine, carboxylic acid, ester, alcohol, silane, alkoxy silane. Exemplary compounds useful in forming the self assembled monolayer include adenine, 2-mercaptobenzimidazole, mercaptobenzothiazole and di(sulfhydrylmethyl) benzene.

In certain embodiments of the conditioning solution of the invention, a variety of other functional organic compounds can be present as the component which forms the self-assembling monolayer. Especially in those embodiments wherein the conditioning solution comprises a transition metal cation, the self-assembling monolayer can be formed from: arylamines such as aniline, aniline derivatives, toluidine and toluidine derivatives; aralkylamines such as benzylamine, tolylamine and benzylamine and tolylamine derivatives; various alkylamines, particularly fatty amines; sulfur-bearing aromatic heterocyclic compounds such as thiophene, thiophene derivatives, benzothiophene, benzothiophene derivatives, benzothiazoles and benzothiazole derivatives; aryl thiols such as thiophenol, thiophenol derivatives, tolyl thiol and tolyl thiol derivatives; and other aralkyl thiols such as benzyl mercaptan and di(sulfhydrylmethyl) benzene.

Among the nitrogen-bearing heterocycles, suitable components from which the self-assembling monolayer can be formed include multi-functional compounds having structure (Ia) or structure (Ib):

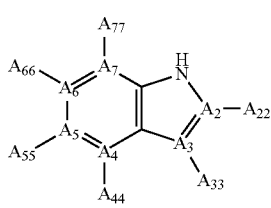
(Ia)

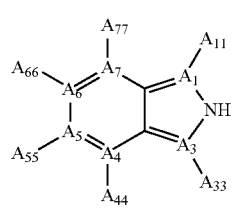
(Ib)

wherein:
$A_1, A_2, A_3, A_4, A_5, A_6$, and $A_7$ are carbon atoms or nitrogen atoms and the sum of nitrogen atoms from $A_1, A_2, A_3, A_4, A_5, A_6$, and $A_7$ is 0, 1, 2, or 3;

$A_{11}, A_{22}, A_{33}, A_{44}, A_{55}, A_{66}$, and $A_{77}$ are selected from the group consisting of electron pair, hydrogen, substituted or unsubstituted alkyl, substituted or unsubstituted aryl, substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubstituted silane or alkoxysilane; and at least one of $A_{11}, A_{22}, A_{33}, A_{44}$, and $A_{55}$ is selected from the group consisting of substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubstituted silane or alkoxysilane.

Although an

moiety of an aromatic heterocycle from which the self-assembling monolayer is formed may comprise a substituted nitrogen, i.e., $R^7$ may be hydrocarbyl, it is preferred that at least one nitrogen atom of the film-forming aromatic heterocycle be bonded to an acidic hydrogen atom, such that the compound may become deprotonated and the resultant negatively charged aromatic heterocycle is available to interact with copper(I) ions and copper(II) ions in a manner which forms a copper(I) rich organometallic adhesive film over the surface of the metal substrate. In short, it is particularly preferred that an aromatic N-bearing heterocycle which serves to form the monolayer comprise

in which $R^7$ is hydrogen, and that the hydrogen be acidic, e.g., wherein it exhibits a $pK_a$ of between about 5 and about 13, such as between about 3.5 and about 11, such as between about 4 and about 10. The ring may be fused to aromatic or cycloalkyl groups, which may be homocyclic or heterocyclic.

Among the suitable multi-functional compounds of structures I(a) and (b) are those having structure (II), structure (III), and structure (IV):

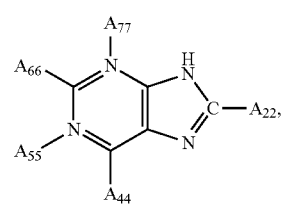
(II)

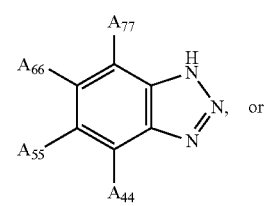
(III)

or

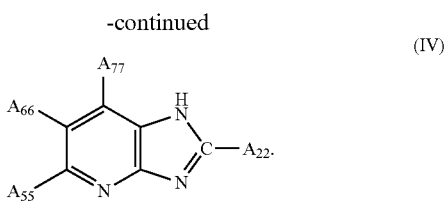

(IV)

wherein $A_{22}$, $A_{44}$, $A_{55}$, $A_{66}$, and $A_{77}$ are as defined in connection with structures (Ia) and (Ib).

Other particular multi-functional compounds for forming the self-assembling monoloayer include those having the structure (V):

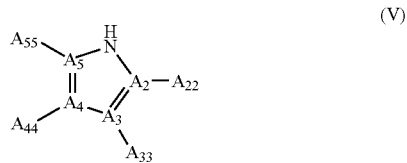

(V)

wherein:

$A_2$, $A_3$, $A_4$ and $A_5$ are carbon atoms or nitrogen atoms and the sum of nitrogen atoms from $A_2$, $A_3$, $A_4$ and $A_5$ is 0, 1 or 2;

$A_{22}$, $A_{33}$, $A_{44}$, and $A_{55}$ are selected from the group consisting of hydrogen, substituted or unsubstituted alkyl, substituted or unsubstituted aryl, substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubstituted silane or alkoxysilane; and at least one of $A_{22}$, $A_{33}$, $A_{44}$, and $A_{55}$ is selected from the group consisting of substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubstituted silane or alkoxysilane.

Various of the nitrogen-containing aromatic heterocyclic compounds which form the self assembled monolayer may also comprise one or more ring substituents selected from the group consisting of cyano, nitro, halo, hydroxy and sulfhydryl. For example, the monolayer film may be formed from heterocyclics such as mercaptobenzamidazoles, mercaptobenzothiazoles, and mercaptobenzotriazoles.

Where the corrosion inhibitor component of the adhesive promoting solution also contains a component which may be chemisorbed to the copper surface, such as benzotriazole or benzotriazole 5-carboxylic acid, the process of the invention, which combines treatment of the substrate with a conditioning solution and subsequent treatment with an adhesion promoting solution containing a heterocyclic corrosion inhibitor, is believed to form a complex of the self assembled monolayer from the conditioning solution, the corrosion inhibitor from the adhesion promoting solution and copper which interact, in some or all instances synergistically, to enhance binding of the copper substrate to the dielectric in the laminating step of the multi-layer circuit board manufacturing process.

In general, the process of the present invention is carried out according to the following protocol:
1. Etch the surface of the copper conducting layer with a micro-etchant composition.
2. Rinse the surface of the copper conducting layer of the etchant composition.
3. Clean the etched surface by contacting the surface with an alkaline cleaner. The alkaline cleaner may optionally comprise a molecule capable of forming a self-assembled monolayer (SAM) on a copper surface.
4. Rinse the surface of the copper conducting layer of the cleaning composition.
5. Contact the cleaned and etched surfaces of the copper conductive layer with a pre-dip composition comprising a molecule capable of forming a self-assembled monolayer (SAM) on a copper surface. If the alkaline cleaner comprises the molecule capable of forming a self-assembled monolayer (SAM) on a copper surface, this step is optional.
6. Rinse the surface of the copper conducting layer of the pre-dip composition.
7. Contact the cleaned, etched, and pre-treated surfaces of the copper conducting layer with an adhesion promotion composition.
8. Rinse the surfaces of the copper conducting layer of the adhesion promotion composition to form an organometallic conversion coating thereon.
9. Dry the surfaces of the copper, conducting layer.
10. Inspect the organometallic conversion coating to confirm the presence of a substantially uniform dark reddish brown to chocolate brown color, free of any marked patchiness or striations. The presence of the uniform brown color indicates the presence of a conversion coating that enhances the adhesion of the copper substrate to the dielectric in the subsequent laminating step of the manufacturing process.
11. Adhere the surface of the copper conducting layer having the organometallic conversion coating thereon to a pre-preg laminate.

The process of the present invention is described in more detail below.

Microetching

In some embodiments, the surface of the copper conducting layer may have previously been provided with a tarnish-inhibiting coating, e.g., by incorporating the tarnish inhibitor into a resist stripping composition used in an immediately preceding step of etch resist stripping. Tarnish inhibitors used in such strippers are, for example, a triazole or other coating. Therefore, the conductive copper surface is generally micro-etched, cleaned, and immersed in a pre-dip composition prior to exposure to the adhesion promotion composition.

The surfaces of copper conducting layer are exposed to an etchant solution by immersion, spraying, cascading, or any other industry appropriate method. The etchant solution may be, for example, micro-etchant comprising about 12 to 20 wt. % Na persulfate and 2 to 5 wt. % sulfuric acid with a minor fraction of phenolsulfate, prepared for example by 40-60% dilution of a concentrated available under the trademark Enthone® PC-7077 (from Enthone Inc.). In general, the copper conducting layer is exposed to the etchant composition for durations between 10 to 120 seconds, such as between 20 to 60 seconds at solution temperatures generally between of 20° C. and 40° C. Etching micro-roughens the copper surface and removes excess copper oxide and other oxide contaminants prior to the treatment according to the invention with a conditioning solution followed by an adhesion promoting solution.

The etched copper conducting layer is next rinsed of the etchant composition, generally in warm water (tap water or deionized) for between 10 and 120 seconds. Preferably, the rinse water is deionized water to allow better process control.

The rinse water is preferably allowed to drain for 10 to 30 seconds in order to avoid undue dilution of the subsequent process composition.

Cleaning

The etched surfaces of the copper conducting layer are next cleaned by immersion, spraying, cascading, or any other industry appropriate method cleaned of the layers in an alkaline cleaner. Useful compositions include Enthone® PC-7086 and Enthone® PC-7096 (10 to 15% concentrations, available from Enthone Inc.). PC 7086 comprises monethanolamine (78 wt. %), 1-methylbenzotriazole (0.06 wt. %), KOH (10 wt. %), water (12 wt. %) and a quaternary ammonium salt (0.02 wt. %), and PC 7096 comprises water (16 wt. %), monethanolamine (72 wt. %), tetramethylammonium hydroxide 25% (3.2 wt. %) ethylenediamine (0.17 wt. %), ethoxylated quaternary ammonium salts (0.032 wt. %), 1-methylbenzyltriazole (0.06 wt. %), aqueous choline base (2.2 wt. %) and KOH (8 wt. %). In general, the copper conducting layers are cleaned for a duration between 30 and 240 seconds, such as between 45 and 90 seconds at solution temperatures generally between of 30° C. and 50° C. In some embodiments of the invention, the cleaning composition optionally further comprises a molecule capable of forming a self assembled monolayer on a copper surface. Such molecules are further described below in connection with the pre-dip composition. Cleaning with an alkaline cleaner is effective to remove oily residues, residual photo-resist and other organic and inorganic contaminants present on the copper substrate as a result of prior steps in the process of manufacturing the circuit boards. It also neutralizes residual acid on the copper surface not fully removed in the rinse step following the micro-etch.

The etched and cleaned copper conducting layer is next rinsed of the alkaline cleaning composition, generally in warm water (tap water or deionized) for between 10 and 120 seconds. Preferably, the rinse water is deionized water to allow better process control. The rinse water is preferably allowed to drain for 10 to 30 seconds in order to avoid undue dilution of the subsequent process composition.

Pre-Treatment with Conditioner

The cleaned and etched surface of the copper conducting layer is next contacted with a conditioner composition comprising a molecule capable of forming a self assembled monolayer on a copper surface. In general, the copper conducting layers are contacted with the pre-dip composition for durations between 30 and 240 seconds, such as between 45 and 90 seconds at solution temperatures generally between of 30° C. and 50° C.

In addition to the nitrogen-bearing heterocycle or other functional organic compound that forms the self assembled monolayer, the conditioning solution may usefully contain any, or any combination, of other components such as, e.g., iodide ion, e.g., in the form of KI, an ethanolamine such as MEA, an anionic surfactant, diethylene glycol butyl ether, and/or zinc ions, e.g., in the form of a zinc compound such as zinc iodide or zinc ammonium carbonate. Iodide and zinc ions in the conditioner help to enhance bonding of the copper substrate to the dielectric in the laminating step that follows application of the adhesion promoting solution. Although synergism is not a requirement of the conditioning compositions used in the methods herein described, it is understood that the alkalinity of the conditioning composition can and often does interact synergistically with the iodide ion optionally contained therein to impart corrosion protection of the surface after subsequent treatment with the adhesion promoting solution, and to enhance bond strength between the conversion coating and the resin after lamination.

In lieu of or in combination with zinc ions, the conditioner may contain certain other transition metal ions including, e.g., nickel, cobalt, silver, gold, palladium, or other platinum group metal. A further option is the presence of copper ions. Zinc or other transition metal is incorporated into the conditioner solution as a salt comprising a counteranion typically selected from the group consisting of chlorides, iodides, phosphates, carbonates, and various carboxylates, including, e.g., malates and oxalates. Oxides may also be used. Thus, the conditioner composition comprises zinc ion in the form of $Zn^{2+}$, $Zn^{2+}$/ammonia complex, zinc oxide, $ZnO_2^=$ or combinations thereof. The composition further includes one or more counteranions selected from the group consisting of chlorides, iodides, bromides, phosphates, carbonates, hydroxides, and various carboxylates, including, e.g., malates, oxalates; or in the case of zincate, the counterion is a cation such as $Na^+$, $K^+$ and/or $NH_4^+$.

Preferably, the conditioner is alkaline, so that it can function as the alkaline cleaner for the copper substrate, thereby obviating the need for separate alkaline cleaning step. Alkalinity also promotes solubility of zinc sources such as, e.g., zinc oxide as well as oxides or hydroxides of other transition metals. More preferably, the conditioner has a pH in the range between about 10 and about 15, still more preferably between about 10 and about 14, most preferably about 13.5 to about 14. A pH in these ranges also functions to maintain shelf life during storage and to extend conditioner bath life during process operations. Alkalinity can conveniently be imparted by the presence of an alkali metal hydroxide such as NaOH or KOH. Potassium hydroxide is preferred because of its favorable solubility and lesser susceptibility to carbonation by absorption of $CO_2$ from the environment.

A particularly preferred source of zinc ions, especially in alkaline solution, is a zinc ammonium complex, or a combination of zinc ammonium complex and alkaline zincate salt. A highly useful commercial source of zinc is the formulation available under the trade designation ZINPLEX 15 which contains zinc ammonium complex (30-60 wt. %), ammonium carbonate (10-30 wt. %), ammonium hydroxide (0.1 to 10 wt. % basis $NH_3$) and minor to trace proportions of zinc oxide in the form of zincate ions. In the preferred 10 to 14 pH range, the zinc is predominantly present as $Zn^{2+}$ or a $Zn^{2+}$/ammonia complex, but at the upper end of the range some zincate ion ($ZnO_2^=$) may also be present and is believed to contribute to thermal stability of the conversion coating subsequently applied from the adhesion promoting solution.

Zinc ion or other transition metal ion, and in particular the combination of zinc ion and ammonia, are believed to promote the formation of a more effective protective film comprising the component that forms the self-assembled monolayer on the copper substrate. The complexing capability of ammonia further contributes to cleaning of the copper surface by contact with the cleaner/conditioner. For example, contact with the alkaline conditioner is effective to remove oxidation and oily residues such as fingerprints from the copper surface and thereby enhance the effectiveness of the subsequently applied adhesion promoting composition.

For purposes of process control, the conditioner is preferably substantially free of peroxide, more preferably substantially free of other oxidants as well. For example, it is generally preferred that the conditioner comprise a solution having an oxidation potential not greater than about 0.8-1.02V, as typically exhibited, e.g., by purine, guanine and adenine.

The preferred presence of iodide ion in the conditioner is believed to promote the reduction of cupric ion to cuprous ion which in turn promotes the formation of complex of cuprous ion with the corrosion inhibitor component of the adhesion promoting solution, e.g., benzotriazole, thereby forming a conversion coating that enhances the bond strength between the copper substrate and the resin in the laminate. Preferably, the concentration of iodide ion in the conditioning solution is between about 0.001 and about 1.00 wt. %.

The conditioning solution also preferably contains an alcohol, more preferably a glycol ether such as, e.g., diethylene glycol butyl ether. Other alcohols described herein for incorporation in the adhesion promoting solution can also optionally be present in the conditioning solution. The alcohol, and especially the preferred glycol ethers are understood to function as dispersants, and further provide solvency and stability. Preferably the conditioning solution contains the alcohol component in a concentration between about 1.00 and about 20.00 wt. %.

The conditioning composition may further contain an alkanolamine such as, e.g., methanolamine. Alkanolamines are cleaning agents with good chelating properties. Preferably, an alkanolamine is present in a concentration between about 1.00 and about 20.00 wt. %.

It is further preferred that the conditioning solution include one or more surfactants, preferably anionic to wet the copper surface, reduce interfacial tension and enhance solubility of the component that forms the self-assembling monolayer on the substrate. Among the anionic surfactants, both aryl sulfonates and sulfate ester salts are preferred. Exemplary anionic surfactants which can be included in the conditioning solution are Na 2-ethylhexyl sulfate, sold under the trade designation Niaproof 08 and Na dodecylbenzenesulfonate, sold under the trade designation Calsoft Las 99. Where present, non-ionic surfactants are preferably present in the conditioning solution in a concentration between about 0.0005 and about 1.00 wt. %.

Preferably, the conditioner comprises the combination of between about 0.1 and about 3 wt. % transition metal selected from the group consisting of Zn, Ni, Co, Cu, Ag, Au, Pd and other platinum group metals, more preferably Zn, Ni, Co, Ag, Au, or Pd, still more preferably Zn, Ni, or Co, most preferably Zn, and between about 0.05 and about 2.5 wt. % of a nitrogen-containing aromatic heterocycle comprising a ring =$NR^7$ group. More preferably, such solution further comprises between about 0.04 and about 4 wt. % iodide ion, preferably in the form of KI.

Preferred embodiments of the conditioner generally also contain an anionic surfactant in a concentration between about 0.001 and about 0.03 wt. % and/or a glycol ether in a concentration between about 0.5 and about 5 wt. %. Preferred embodiments generally also contain an alkanolamine such as monoethanolamine in a concentration between about 0.5 and about 5 wt. %.

In each of these various embodiments, the nitrogen-bearing aromatic heterocycle preferably comprises purine or a purine derivatives in a concentration between about 0.05 and about 2.5 wt. %.

The etched copper conducting layer is next rinsed of the conditioner composition, generally in warm water (tap water or deionized) for between 10 and 120 seconds. Preferably, the rinse water is deionized water to allow better process control. The rinse water is preferably allowed to drain for 10 to 30 seconds in order to avoid undue dilution of the subsequent process composition. Preferably prior to contact with the adhesion promotion composition, the copper surface will be substantially dry or have only minimal wetness.

Adhesion Promotion

The cleaned and etched surfaces of the copper conducting layer are next contacted with an adhesion promotion composition. Contact with the adhesion promotion composition may be by any conventional means, for example by immersion in a bath of the adhesion promotion composition or by spraying or any other means of contact. Contact may be as part of a continuous process. As is well understood in the art, immersion processes involve simply dipping the substrate into a bath of the composition for the desired period. Spray processes typically involve application using a series of automated squeegee-type mechanisms. The method of application is not critical to the invention. However, as discussed above, the tolerance for copper loading can be greater for spray processes than for dip processes because, for example, there is more bath stagnation with dip processes.

The adhesion promotion composition may comprise an oxidizing agent. Useful oxidizing agents include hydrogen peroxide and persulfates, e.g., ammonium persulfate, potassium persulfate, sodium persulfate, and the like. In general, hydrogen peroxide is incorporated into the adhesion promotion composition of the invention as an oxidizing agent to oxidize copper on the substrate. The oxidizing agent, e.g., hydrogen peroxide, is present in the adhesion promotion composition at a concentration of at least about 1 wt %. The concentration of oxidizing agent, e.g., hydrogen peroxide, is typically no greater than about 20%, and in certain preferred embodiments it is no greater than about 10%. One preferred concentration of hydrogen peroxide is from about 0.5% by weight of the adhesion promotion composition to about 4% by weight. It has been found that when the concentration of hydrogen peroxide in the adhesion promotion composition is too high the structure of the roughened surface of the conducting layer forms a somewhat dendritic structure which is more fragile than the desired roughening effect, so that it forms a weaker bond than when lower concentrations of hydrogen peroxide are used. Moreover, the organometallic conversion coating becomes hazy if there is over-etching by too much hydrogen peroxide. All percentages herein are by weight unless indicated otherwise. Moreover, all concentrations are normalized such that they refer to concentrations of each element as if used in 100% concentrations. For example, in one embodiment the $H_2O_2$ solution added to the composition is 35% concentrated $H_2O_2$, rather than a 100% concentrated $H_2O_2$. However, the 20%, 10%, 4% etc. numbers provided above are % of 100% $H_2O_2$ in the final composition, not % of 35% $H_2O_2$ in the final composition.

To enhance the stability of the composition, the composition is preferably initially substantially free of copper and any other transition metals which have a tendency to destabilize the oxidizing agent. For example, copper ions are avoided in the initial solution because they have a tendency to destabilize hydrogen peroxide. This requirement pertains to the initial composition in that the copper is avoided in the fresh composition before its use to promote adhesion. Upon use, however, copper is not excluded from the composition because, in fact, copper does tend to accumulate in the solution during use.

Certain other transition metal ions have been found to contribute to the thermal stability of the conversion coating without destabilizing the peroxide. The transition metals beneficially contained in the initial bath include nickel, cobalt, silver, gold, palladium and other platinum group metals.

Other than nickel, cobalt, silver, gold, palladium, other platinum group metals' (plus copper with which the composition becomes loaded during use), the adhesion promoting composition is "substantially" free of transition metals in that any trace amounts in the composition are sufficiently low as to not significantly contribute to degradation of the oxidizing agent; for example, sufficiently low as to not increase the degradation rate by more than about 10%.

The adhesion promotion composition comprises one or more inorganic acids for the main purpose of solubilizing copper, and maintaining other components of the composition in solution. A variety of acids, such as mineral acids including phosphoric acid, nitric acid, sulfuric acid, and mixtures thereof are workable. In one preferred embodiment both $HNO_3$ and $H_2SO_4$ are employed. It has been discovered that in addition to solubilizing the Cu, $H_2SO_4$ helps to moderate the etch rate, and therefore help prevent over-etching of the substrate in isolated areas. The $HNO_3$ increases the etch rate; increases the solubility of Cu; helps prevent premature sludge formation; and works synergistically with $H_2O_2$, $H_2SO_4$, and the corrosion inhibitor to darken the coating. The overall acid concentration in the composition is generally at least 1%, preferably at least 8%, and in certain preferred embodiments at least 14% of the composition. The etch rate is slowed excessively if the acid concentration is too high, with the exception of nitric acid, and can yield an organometallic conversion coating which is non-uniform and too light in color. For this reason, the acidity level in previous compositions had been typically selected to be about 20%. However, in the present invention it is possible to push the acidity level up to about 25% and above, because with the other additives described herein, the coating is not lightened as would otherwise be expected with an acid level elevated to about 25%. The overall acid level is typically maintained below about 50%. In one preferred embodiment, therefore, there is between about 22% and about 28% acid, including about 20% $H_2SO_4$ (50% grade) and about 5% $HNO_3$ (95% grade). In one preferred embodiment, the inorganic acid constitutes at least about 30% of the composition. Another preferred embodiment employs 28% $H_2SO_4$ (50% grade) and 5% $HNO_3$ (95% grade). $HNO_3$ is employed in these preferred embodiments because it has been discovered that it has a unique ability to solubilize the inhibitor-Cu complex better than do other mineral acids. It contributes to the etch rate, improves the topography of the conversion coating and enhances copper loading capacity of the adhesive promoting bath. While weight fractions given above are percentages of the acids in the final composition and are based on use of 100% concentrated acid, as discussed above, the preferred forms of the acids actually added are 50% concentrated $H_2SO_4$ and about 95% concentrated $HNO_3$.

Where a combination of nitric and sulfuric acids is contained in the adhesion promoting solution, the total mineral acid content is preferably at least about 20 wt. %. It is further preferred that nitric acid be present in a concentration of at least the difference between the total mineral acid content and 20 wt %.

Inasmuch as certain of the preferred compositions employ $HNO_3$, the overall composition is formulated to be compatible therewith. In particular, thiourea-based complexing agents are specifically avoided due to the explosive nature thereof when mixed with $HNO_3$.

In general, triazoles, tetrazoles, imidazoles and mixtures thereof have been proposed as corrosion inhibitors in adhesion promotion compositions. Useful corrosion inhibitors include benzotriazole, triazole, benzimidazole, imidazole, Benzotriazole (BTA) compounds are most preferred due to their effectiveness in chelating Cu, their effectiveness to inhibit corrosion, and their effectiveness to help darken the organometallic conversion coating surface. The most preferred BTA compound currently is 1,2,3-benzotriazole, also known as aziamino-benzene or benzene azimide, and has the formula $C_6H_4NHN_2$. Purine and the purine derivatives of Formula I can also be used, as may the multi-functional compounds of Formulas I(a), I(b), III, IV and V. Particularly desirable results are achieved with corrosion inhibitor concentrations of at least 0.1%, more preferably more than 0.5% by weight, and something more than 1% by weight. Generally, the corrosion inhibitor will be present in the composition in an amount no greater than 20%, preferably no greater than 10%, and more preferably less than 5% by weight of the total weight of the adhesion promotion composition. High concentrations, such as more than 5% can be desirable as they can allow a reduction in the processing time. In certain preferred embodiments, however, the concentration is less than 5% or even less than 1%.

The invention also employs various additives to the adhesion promoting composition, as discussed in more detail below, selected from among monomeric and oligomeric alcohols, and polymeric, oligomeric, and monomeric alcohol derivatives, including, but not limited to alcohol sulfates, sulfonates, and ethoxylates.

Preferred embodiments of the invention may employ a sulfonated anionic surfactant. It has been discovered that in addition to surface wetting, this surfactant helps to stabilize the $H_2O_2$. The most particularly preferred of such surfactants is dodecylbenzene sulfonic acid (DDBSA). DDBSA is available from Ashland Distribution Company of Santa Ana, Calif.; or from Pilot Chemical Company of Santa Fe Springs, Calif. under the trade designation Calsoft LAS 99. Other such surfactants include sodium dodecylbenzene sulfonate available from Witco Corporation, Organic Division, of New York, N.Y. under the trade designation Witconate 1850; the isopropyl amine salt of branched alkyl benzene sulfonate available from Stepan Company of Northfield, Ill. under the trade designation Polystep A-11; and TEA dodecylbenzene sulfonate available from Norman, Fox & Company of Vernon, Calif. under the trade designation Norfox T-60. The sulfonated anionic surfactant is used in a quantity sufficient to achieve surface wetting and $H_2O_2$ stabilization, which quantity can vary depending on the overall composition of the adhesion promoter. One currently preferred embodiment includes at least about 0.0001% of sulfonated anionic surfactant. As a general proposition, the sulfonated anionic surfactant concentration is at least about 0.005%, preferably at least about 0.1%; and is less than about 10%, preferably less than about 5%, more preferably less than about 2%. One specific example employs 0.002% of this surfactant, particularly DDBSA.

A currently preferred embodiment of the invention also incorporates a sulfated anionic surfactant. One preferred example of this compound is sodium 2-ethylhexyl sulfate, also known as 2-ethylhexanol sulfate sodium salt, having the formula $C_4H_9CH(C_2H_5)CH_2SO_4Na$. This is available from Niacet Corporation of Niagara Falls, N.Y. under the trade designation Niaproof 08, which contains 38.5 to 40.5% sodium 2-ethylhexyl sulfate and the balance water. Alternatives include sodium tetradecyl sulfate available from Niacet under the trade designation Niaproof 4, sodium lauryl sulfate available from Stepan Company of Northfield, Ill. under the trade designation Polystep B-5, and sodium n-decyl sulfate available from Henkel Corporation/Emery Group, Cospha/CD of Ambler, and Pennsylvania under the trade designation Sulfotex 110. The addition of a sulfated anionic surfactant compound surprisingly permits the acidity level to be raised, without the expected detrimental effect of lightening the coating. Because the acidity level can be raised in this manner, copper loading is increased. It also helps darken the coating. This compound is present in this embodiment in a concentration sufficient to increase copper loading without substantial lightening of the coating. The typical concentration is at least about 0.001%, and preferably at least about 0.1%. The concentration of sulfated anionic surfactant is no greater than about 10%, and preferably no greater than about 5%. One preferred range is between about 0.05 and 2%. In one preferred embodiment the sulfated anionic surfactant concentration is about 0.5%. In another it is 0.15%.

In a currently preferred embodiment, the composition also includes a nonionic surfactant. Anionic and nonionic surfactants complement each other in the action of the adhesion promoter to produce a conversion coating with the most favorable properties for enhancing the adherence of resin to copper conductor. Anionic surfactants are effective in removing oily/greasy residue on the copper substrate and preventing their re-deposition. But anionic surfactants also comprise a negatively charged head that can easily be deactivated by water hardness ($Ca^{2+}$ and $Mg^{2+}$ ions) that inhibits their cleaning efficiency. Builders can optionally be used to sequester calcium and magnesium ions and thereby preserve the effectiveness of anionic surfactants. But the presence of nonionics assures that the oily residues are removed even in hard water adhesion promoting formulations because, lacking a negative charge, nonionics are unaffected by calcium or magnesium ions.

In any event, the combination of an anionic and nonionic surfactant in the adhesion promoting solution has been discovered to provide the unexpected additional benefit of improving peel strength. In one preferred embodiment this surfactant is one or more ethoxylated nonylphenols, such as polyoxyethylene nonylphenol. Polyoxyethylene nonylphenol is available from Dow Chemical Company of Midland, Mich. under the trade designation Tergitol NP9. Alternatives include an ethoxylated nonylphenol available from Dow Chemical Company of Midland, Mich. under the trade designation Tergitol NP8, nonylphenoxypolyethoxyethanol available from Union Carbide Corporation of Danbury, Conn. under the trade designation Triton N, and ethoxylated nonylphenol (or nonoxynol-2) available from Rhone-Poulenc, Surfactant & Specialty Division of New Jersey under the trade designation Igepal CO-210. The concentration of this surfactant is selected to be sufficient to improve peel strength. One currently preferred embodiment includes at least about 0.0001% of an ethoxylated phenol derivative. As a general proposition, the concentration is at least about 0.01%, preferably at least about 0.2%; and is less than about 10%, preferably less than about 5%. One preferred range is between about 0.0001% and about 2%. One exemplary embodiment contains 0.02%.

It has been discovered that incorporating certain alcohols into the adhesion promotion composition that solubilize the BTA copper complex can enhance copper loading capacity of the adhesion promotion composition. The alcohols may be monohydric or they may be multihydric, e.g., dihydric (i.e., diols), trihydric (i.e., triols), tetrahydric, pentahydric, etc. The alcohols may be primary, secondary, and/or tertiary alcohols.

Suitable aliphatic alcohols include monohydric alcohols such as methanol, ethanol, n-propanol, isopropanol, n-butanol, isobutanol, tert-butanol, pentanol, neopentanol, hexanol, cyclohexanol, furfuryl alcohol, and tetrahydrofurfuryl alcohol, and so forth. In general, due to elevated process conditions, alcohols having higher boiling points, e.g., above about 110° C. are preferred over alcohols having lower boiling points.

Suitable aliphatic saturated alcohols include dihydric alcohols, e.g., diols, such as ethylene glycol; propylene glycols such as propane-1,2-diol and propane-1,3-diol; butylene glycols such as butane-1,2-diol, butane-1,3-diol, butane-2,3-diol, butane-1,4-diol, and 2-methylpropane-1,3-diol; pentylene glycols such as pentane-1,5-diol, pentane-1,4-diol, pentane-1,3-diol, 2,2-dimethyle-1,3-propanediol, etc.; hexylene glycols such as hexane-1,2-diol, hexane-1,4-diol, hexane-1,5-diol, hexane-1,6-diol, 2-methylpentane-2,4-diol, 1,2-cyclohexanediol, etc.; heptylene glycols such as 2-methyl-2-propyl-propane-1,3-diol; octylene glycols such as 2-ethyl-hexane-1,3-diol and 2,5-dimethylhexane-2,5-diol; nonanediols, decanediols, dodecanediols, and so forth. Also suitable are certain derivatives of diols, such as ethers, including methoxypropanols, methoxybutanols, etc.

Suitable aliphatic saturated alcohols also include triols, such as glycerol, butanetriol, pentanetriol, etc.

Oligomeric alcohols are those alcohols and alcohol derivatives, e.g., ethers, that comprise multiple repeat units of the general formula:

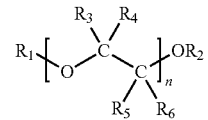

wherein $R_1$, $R_2$, $R_3$, $R_4$, $R_5$, and $R_6$ may be hydrogen or a low molecular weight hydrocarbon having, generally from 1 to about 6 carbon atoms, more generally from 1 to about 3 carbon atoms, and even more generally from 1 to 2 carbon atoms. In general, the number of repeat units in an oligomer is low, such as between about 2 and about 12, more generally between about 2 and about 6, more generally, 2, 3, or 4. Suitable oligomeric alcohols include diethylene glycol, diethylene glycol methyl ether, diethylene glycol dimethyl ether, triethylene glycol, triethylene glycol monomethyl ether, triethylene glycol dimethyl ether, dipropylene glycol, Also suitable are unsaturated diols, such as butene diol, hexene diol, and acetylenics such as butyne diol. An example of a suitable trihydric alcohol is glycerol.

This additive is present in this embodiment at a concentration sufficient to increase copper loading of the composition. Typically, this concentration is at least about 0.01%, and in certain embodiments is at least about 0.5%. The concentration of this additive is no greater than about 20%, and in certain embodiments no greater than about 10%.

Preferred alcohols include propylene glycol and/or oligomeric polypropyleneglycol having a molecular weight generally between about 300-4000 g/mol and about 4000 g/mol, preferably about 80 g/mol and about 76.09 g/mol. The propylene glycol and/or oligomeric polypropyleneglycol may be added in a concentration range between about 0.1 wt. % and about 5 wt. %, more suitably between about 0.2 wt. % and about 1 wt. %, such as about 0.5 wt. %. Incorporation of propylene glycol and/or oligomeric polypropyleneglycol into the adhesion promotion composition has been discovered to generally improve the peel strength of the copper conducting layer with the pre-preg and to improve the appearance of the organometallic conversion coating.

Another preferred alcohol that has proven to be especially effective is the oligomer triethylene glycol (TEG). In particular, compositions containing this oligomer have copper-loading capacity of about 30 grams copper per liter solution up to about 35 and even about 40 g/L in dip process applications. In spray process and flooded immersion process applications, automated and conveyorized applications, these compositions have copper-loading capacity of up to about 45 g/L and even up to 50 g/L. This triethylene glycol is an oligomer in that it is a molecule of intermediate relative molecular mass with a structure comprising a small number of units derived from molecules of lower relative molecular mass. This is in contrast to a polymer, which has a high relative molecular mass. This triethylene glycol is also oligomeric in that its properties vary significantly with removal of one of its units; as opposed to polymeric compounds, with which removal of one or a few units has a relatively negligible effect on molecular properties. This triethylene glycol has the molecular formula $C_6H_{14}O_4$, more specifically, $HO(C_2H_4O)_2H$, and a molecular weight of 150.17. Triethylene glycol is present in this embodiment at a concentration of at least about 0.01%, typically at least about 0.5%, and in one embodiment at least about 0.8%. The concentration of TEG is no greater than about 20%, and preferably no greater than about 10%. In a currently preferred embodiment the TEG concentration is about 1%. The TEG also has the added benefit of helping to stabilize the $H_2O_2$.

The composition optionally also includes an additional stabilizing agent for the $H_2O_2$. Suitable stabilizing agents include, for example, dipicolinic acid, diglycolic and thiodiglycolic acid, ethylene diamine tetra-acetic acid and its derivatives, magnesium salt of an aminopolycarboxylic acid, sodium silicate, phosphates, phosphonates, and sulfonates. When the composition includes a stabilizing agent, preferably the stabilizing agent is present in an amount of from 0.001% or even at least 0.005% by weight of the adhesion promotion composition. Generally there is no more than 1% by weight in the composition. The currently preferred composition contains an additional stabilizing agent, but relies primarily on the stabilizing function of the TEG, as described above.

The composition further includes a source of halide ions. This source is preferably HCl, and provides a chloride ion concentration in the range of about 10 pp to 100 ppm, preferably between about 20 ppm and about 100 ppm, even more preferably between about 30 ppm and about 100 ppm. The units "ppm" in the context of an aqueous composition are in terms of mass: volume, so 1 ppm is generally equivalent to 1 microgram per milliliter, or about 1 mg per liter. In one embodiment, the chloride ion concentration range is between about 60 and 65 ppm. In one embodiment, the chloride ion concentration range is between about 65 and 75 ppm. In one embodiment, the chloride ion concentration range is between about 75 and 85 ppm. In one embodiment, the chloride ion concentration range is between about 85 and 95 ppm. Preferred ranges are different for other embodiments depending on the overall composition and application. This increased Cl⁻ level in comparison to previous formulations helps to increase the ratio of cuprous copper to cupric copper, which has been discovered to increase peel strength. The Cl⁻ level tapers off and then stabilizes during use of the composition. As such, an initial Cl⁻ ion concentration of between about 20 ppm and about 100 ppm is preferred in one embodiment in order to achieve Cl⁻ ion content in service of on the order of about 20 to 80 ppm.

The adhesion promotion composition is manufactured by mixing the components in an aqueous solution, preferably using deionized water. In accordance with standard safe practice, hydrogen peroxide is added to the composition in a diluted form.

In one form the adhesion promotion composition is ready to use and can be used directly for immersion or other exposure of the substrate. In another form the invention is a concentrate that is to be diluted to form the composition for immersion or other exposure.

An exemplary ready-to-use composition includes the following:
0.5 to 8 wt % $H_2O_2$
16 to 25 wt % $H_2SO_4$
0.1 to 10 wt % $HNO_3$
0.1 to 2 wt % 1,2,3-benzotriazole
0.01 to 5 wt % triethylene glycol
0.05 to 2 wt % 2-ethyloxosulfonate (Niaproof 08)
0.0001 to 2 wt % dodecylbenzene sulfonic acid (DDBSA)
0.0001 to 2 wt % polyoxyethylene nonylphenol (Tergitol NP9)
40 to 70 wt % deionized water When provided as a concentrate, the ranges described above for the preferred proportions of the ingredients are essentially doubled, because the product is diluted with, for example, 50% water upon formulation of the composition for use. In one embodiment, the concentrate has the following ingredients:
32-50 wt % $H_2SO_4$
0.2 to 20 wt % $HNO_3$
0.2 to 4 wt % 1,2,3-benzotriazole
0.02 to 10 wt % triethylene glycol
0.002 to 4 wt % 2-ethyloxosulfonate (Niaproof 08)
0.0002 to 4 wt % dodecylbenzene sulfonic acid (DDBSA)
0.0002 to 4 wt % polyoxyethylene nonylphenol (Tergitol NP9)

The $H_2O_2$ is added later and is not included in the concentrate formulation. This concentrate is then incorporated into an overall solution in which, for example, about 43 wt % is this concentrate, about 7 wt % is $H_2O_2$, and about 50 wt % is water.

As mentioned above, various preferred embodiments of the adhesion promoting composition also contain a transition metal ion but it has been found important to be selective in choosing a transition metal ion for the composition. A substantial class of transition metal ions can adversely affect the stability of the peroxide component of the composition and/or promote release of excessive volumes of hazardous gases, e.g., $H_2$, $O_2$, $NO_x$ and $SO_x$. However, other transition metal ions can contribute to the thermal stability of the conversion coating produced in the adhesion promoting step of the process without material adverse effect on the stability of the peroxide and without generating excessive volumes of hazardous gases.

Preferred transition metal ions for inclusion in the adhesion promoting solution include zinc, nickel, copper, cobalt, silver, gold, palladium and other platinum group metals. The transition metal ions are preferably incorporated into the adhesion promoting composition in the form of their salts. Thus, the preferred adhesion promoting solution contains zinc, nickel, copper, cobalt, silver, gold, palladium or other platinum group metals in the form of their cations plus a counteranion derived from the salt that serves as the transition metal ion. More preferably, the transition metal ion comprises Zn, Ni, Co, Ag, Au, Pd or other platinum group metals, still more preferably Zn, Ni, Co, or Ag, or Zn, Ni, or Co. Preferably, the transition metal is introduced in the form of a sulfate, chloride, bromide, iodide, phosphate, or any of various carboxylates, including, e.g., malates and oxalates. Complex salts, such as, e.g., zinc ammonium halides, can also be used. Preferably, the adhesion promoting solution contains the transition metal ion in a concentration between about 0.02 wt. % and about 2 wt. %, a nitrogenous corrosion inhibitor in a concentration between about 0.1 and about 5 wt. %, sulfuric acid in a concentration between about 10 and about 50 wt. % and hydrogen peroxide in a concentration between about 1 and about 10 wt. %. More preferably, the composition contains one or more anionic surfactants in a concentration between about 0.01 and 1 wt. %, and an alcohol in a concentration between about 0.1 and 3 wt. %. Still more preferably, the composition further comprises a one or more nonionic surfactants in a concentration between about 0.0005 and about 0.2 wt. %. In each of these various embodiments, it is preferred that the composition further comprise nitric acid in a concentration between about 0.5 and about 15 wt. %.

Most preferably, the transition metal ion component of the adhesion promoting solution comprises zinc ion. A particularly preferred source of zinc ion is $ZnSO_4$.

In an especially preferred embodiment, the adhesion promoting composition comprises:
- 20-35 wt. % sulfuric acid;
- 2-8 wt. % nitric acid;
- 4-12 wt. % hydrogen peroxide;
- 0.2 to 3 wt. % benzotriazole (Cobratec 99);
- 0.05 to 0.5 wt. % zinc sulfate;
- 0.2 to 2 wt. % triethylene glycol;
- 0.02 to 0.5 wt. % Na 2-ethylhexyl sulfate sold under the trade designation Niaproof 08;
- 0.0005 to 0.01 wt. % Na dodecylbenzenesulfonate sold under the trade designation Calsoft Las 99;
- 0.0005 to 0.01 wt. % polyoxyethylene nonylphenol sold under the trade designation Tergitol NP9; and balance deionized water, typically 45 to 70 wt. %.

Contact of the copper surface with the adhesion promotion composition is typically at a temperature between about 20° C. and about 40° C., though temperatures reasonably outside this range are operable. The contact time is generally no less than 1 second, preferably no less than 5 seconds, and often at least 10 seconds, most preferably at least 30 seconds. The maximum contact time may be up to 10 minutes, although preferably the contact time is no greater than 5 minutes, most preferably no greater than 2 minutes. A contact time of about 1 minute or less than 1 minute is standard. If the contact time of the adhesion promotion composition with the copper surface is too long, there is a risk that the copper surface may be etched away due to dissolution and/or that a deposit other than the micro-porous crystalline deposit that forms the micro-roughened surface will be deposited onto the surface of the conducting material.

The copper conducting layer having the organometallic conversion coating thereon is next rinsed of the adhesion promotion composition, generally in warm water (tap water or deionized) for between 10 and 120 seconds. Preferably, the rinse water is deionized water to allow better process control. The rinse water is preferably allowed to drain for 10 to 30 seconds and the surface is then dried.

After contact of the copper surface with the adhesion promotion composition to form the micro-roughened surface, generally a Pre-preg layer may be placed directly adjacent to the copper surface and the Pre-preg layer adhered directly to the copper surface in the adhesion step, forming a multi-layer PCB.

Appropriate substrate materials for a printed circuit board include, for example, high-pressure laminates (i.e., layers of fibrous materials bonded together under heat and pressure with a thermosetting resin). In general, a laminate layer comprises an electrical-grade paper bonded with phenolic or epoxy resin or a continuous-filament glass cloth bonded with an epoxy-resin system. Specific examples of laminate layers are: XXXPC which is an electrical paper impregnated with phenolic resin; FR-2 which is similar to XXXPC with a flame retardant property; FR-3 which is a self-extinguishing laminate of electrical paper and epoxy resin; G-10 which is a laminate of glass cloth sheets and epoxy resin; FR-4 which is a self-extinguishing laminate similar to G-10; G-11 which is a glass cloth and epoxy mixture; FR-5 which is a flame-resistant version of G-11. In one embodiment of the present invention, the organic circuit board material is an FR-4 laminate layer that is placed on top of, and in intimate contact with the passive component pattern, and the two are laminated together.

Generally in the adhesion step heat and pressure are applied to initiate the adhesion reaction. In the adhesion step, mechanical bonding is due to penetration of the polymeric material of the insulating layer into the micro-roughened surface provided in the adhesion promotion step. Although it may be desirable to follow the adhesion promotion step with a specially formulated rinse step, it is often adequate to rinse just with water.

A pre-preg insulating layer is applied directly to the micro-roughened surface, i.e., preferably without any intermediate metal deposition onto the micro-roughened surface or the like, although optionally with a post-treatment cupric oxide removal or reduction operation to further enhance the bond strength as disclosed in U.S. Pat. No. 6,294,220. Pressure is applied by placing the layers that are to form the multi-layer laminate of the PCB in a press. Where pressure is applied it is generally from 100 to 400 psi, preferably from 150 to 300 psi. The temperature of this adhesion step will generally be at least about 100° C., preferably between about 120° C. and about 200° C. The adhesion step is generally carried out for any period from 5 minutes to 3 hours, most usually from 20 minutes to 1 hour, but is for sufficient time and pressure and at a sufficiently high temperature to ensure good adhesion between the first and second layers. During this adhesion step, the polymeric material of the insulating layers, generally an epoxy resin tends to flow ensuring that the conductive pattern in the metal is substantially sealed between insulating layers, so subsequent penetration of water and air is avoided. Several layers may be placed together in the adhesion step to effect lamination of several layers in a single step to form the MLB.

Though the exemplary arrangement discussed at length herein is a pre-preg layer adhered to a copper surface, the invention also includes improving adhesion of other dielectric materials, whether permanent or temporary, to copper. For example, the invention improves adhesion between copper and a solder mask that is dielectric. It similarly improves copper adhesion with inks, polymeric photo-resists, and dry films. It also has application in connection with photo-imageable dielectrics or other dielectrics used in the context of high density interconnect and sequential build up technologies.

Having described the invention in detail, it will be apparent that modifications and variations are possible without departing from the scope of the invention defined in the appended claims.

EXAMPLES

The following non-limiting examples are provided to further illustrate the present invention.

Example 1

Control Adhesion Promotion Process

Multiple adhesion promotion processes were carried out on test copper coupons using commercially available micro-etchant, cleaner, and adhesion promotion compositions. These processes, designated A0S, were control processes and were carried out in order to provide comparative data for peel strength, conversion coating appearance, and number of solder dip cycles to delamination.

The adhesion promotion processes were carried out on three sets of 1" (25.4 mm) by 2" (50.8 mm) copper coupons according to the following protocol:

1. Contact the surfaces of copper coupons with microetchant Enthone® PC-7077 (40-60% concentration, available from Enthone Inc.) by immersion or spraying the coupons in or with the microetchant composition for 30 to 45 seconds at a solution temperature between of 27° C.±3° C. PC-7077 is a conventional micro-etchant that contains Na persulfate, Na phenolsulfate and sulfuric acid.

| PC 7077 NON-FLUORIDE MICROETCH | MAKE-UP 100 GALS. AMT IN. LBS. | GALS. | % BY WT. (F = 1.89) |
|---|---|---|---|
| SOFT WATER | 606.507 | 72.68 | 55.48 |
| SODIUM PERSULFATE | 317.028 | | 29.00 |
| SODIUM PHENOLSULFONATE POWDER | 4.373 | | 0.40 |
| SULFURIC ACID 50% | 165.292 | | 15.12 |
| TOTAL | 1093.200 | | 100.00 |

2. Rinse the coupons in warm water (tap water or deionized) for 30 seconds.
3. Contact the etched surfaces of the copper coupons with alkaline cleaner/Conditioner Enthone® PC 7096 10 to 15% concentration, available from Enthone Inc.) by immersion or spraying the coupons in or with the alkaline cleaner composition for 60-120 seconds at a solution temperature between of 43° C.±6° C.
4. Rinse the coupons in warm water (tap water or deionized) for 30 seconds. The water was allowed to drain from the coupons for 10 to 20 seconds to avoid unnecessary dilution of the adhesion promotion composition.
5. Contact the cleaned and etched surfaces of the three copper coupons with adhesion promotion composition AlphaPREP® PC-7030 (100% concentration, available from Enthone Inc.) by immersion or spraying the coupons in or with the adhesion promotion composition. One set of coupons was contacted with AlphaPREP® PC-7030 for 45 seconds. One set of coupons was contacted with AlphaPREP® PC-7030 for 1 minute. One set of coupons was contacted with AlphaPREP® PC-7030 for 2 minutes. The solution temperature between of 43° C.±6° C. The adhesion promotion composition contained the following components and concentrations:

| Component | Concentration |
|---|---|
| $H_2O_2$ | 7.2 wt. % |
| $H_2SO_4$ | 28.0 wt. % |
| $HNO_3$ | 5.0 wt. % |
| 1,2,3-Benzotriazole | 1.0 wt. % |
| Triethylene glycol | 0.9 wt. % |
| 2-ethyoxosulfonate (Niaproof 08) | 0.15 wt. % |
| Dodecylbenzene Sulfonic acid (DDBSA) | 0.002 wt. % |
| Polyoxyethylene Nonylphenol (Tergitol NP 9) | 0.002 wt. % |
| Chloride ion | 65-75 ppm |
| Water (Deionized) | Balance |

6. Rinse the coupons in warm water (tap water or deionized) for 30 seconds.
7. Air dry the coupons at ambient temperature or up to about 35-40° C., for between 30 seconds to 5 minutes, as needed.

The copper coupons treated in this manner were inspected for coating appearance and defects prior to lamination to a standard FR4 pre-preg laminate such as Isola FR370HR (high Performance FR-4 material).

Example 2

Control Adhesion Promotion Process

Multiple adhesion promotion processes were carried out on test copper coupons using commercially available microetchant, cleaner, and adhesion promotion compositions. These processes, designated A0, were control processes and were carried out in order to provide comparative data for peel strength, conversion coating appearance, and number of solder dip cycles to delamination. The A0 control processes were carried out in a similar manner to the A0S control processes of Example 1, except that the chloride ion concentration of the adhesion promotion composition was increased to between about 85 and about 95 ppm.

The adhesion promotion processes were carried out on three sets of 1" (25.4 mm) by 2" (50.8 mm) copper coupons according to the following protocol:

1. Contact the surfaces of three copper coupons with microetchant Enthone® PC-7077 (40-60% concentration, available from Enthone Inc.) by immersion or spraying the coupons in or with the microetchant composition for 30 to 45 seconds at a solution temperature between of 27° C.±3° C.
2. Rinse the coupons in warm water (tap water or deionized) for 30 seconds.
3. Contact the etched surfaces of the three copper coupons with alkaline cleaner Enthone® PC-7096 (10 to 15% concentration, available from Enthone Inc.) by immersion or spraying the coupons in or with the alkaline cleaner composition for 60 seconds at a solution temperature between of 43° C.±6° C.
4. Rinse the coupons in warm water (tap water or deionized) for 30 seconds. The water was allowed to drain from the coupons for 10 to 20 seconds to avoid unnecessary dilution of the adhesion promotion composition.
5. Contact the cleaned and etched surfaces of the three copper coupons with adhesion promotion composition AlphaPREP® PC-7030 (100% concentration, available from Enthone Inc.) by immersion or spraying the coupons in or with the adhesion promotion composition. One set of coupons was contacted with AlphaPREP® PC-7030 for 45 seconds. One set of coupons was contacted with AlphaPREP® PC-7030 for 1 minute. One set of coupons was contacted with AlphaPREP® PC-7030 for 2 minutes. The solution temperature between of 43° C.±6° C. The adhesion promotion composition contained the following components and concentrations:

| PC 7030M (With MPG: Mono-propylene Glycol) | |
|---|---|
| Component | Concentration |
| $H_2O_2$ | 7.2 wt. % |
| $H_2SO_4$ | 28.0 wt. % |
| $HNO_3$ | 5.0 wt. % |
| 1,2,3-Benzotriazole | 1.0 wt. % |
| Triethylene glycol | 0.9 wt. % |
| Mono-propylene Glycol | 0.5 wt. % |
| 2-ethyoxosulfonate (Niaproof 08) | 0.15 wt. % |
| Dodecylbenzene Sulfonic acid (DDBSA) | 0.002 wt. % |
| Polyoxyethylene Nonylphenol (Tergitol NP 9) | 0.002 wt. % |

-continued

PC 7030M (With MPG: Mono-propylene Glycol)

| Component | Concentration |
|---|---|
| Methane Sulfonic Acid (MSA) 70 % | 2.00 wt. % |
| Chloride ion | 85-95 ppm |
| Water (Deionized) | Balance |

PC 7030M-1 (Without MPG: Mono-propylene Glycol.

| Component | Concentration |
|---|---|
| $H_2O_2$ | 7.2 wt. % |
| $H_2SO_4$ | 28.0 wt. % |
| $HNO_3$ | 5.0 wt. % |
| 1,2,3-Benzotriazole | 1.0 wt. % |
| Triethylene glycol | 0.9 wt. % |
| 2-ethyoxosulfonate (Niaproof 08) | 0.15 wt. % |
| Dodecylbenzene Sulfonic acid (DDBSA) | 0.002 wt. % |
| Polyoxyethylene Nonylphenol (Tergitol NP 9) | 0.002 wt. % |
| Methane Sulfonic Acid (MSA) 70% | 2.00 wt. % |
| Chloride ion | 85-95 ppm |
| Water (Deionized) | Balance |

Although not used in this Example, the following formulation provides equivalent results.

| Component | Concentration |
|---|---|
| $H_2O_2$ | 7.2 wt. % |
| $H_2SO_4$ | 28.0 wt. % |
| $HNO_3$ | 5.0 wt. % |
| 1,2,3-Benzotriazole | 1.0 wt. % |
| Triethylene glycol | 0.9 wt. % |
| 2-ethyoxosulfonate (Niaproof 08) | 0.15 wt. % |
| Dodecylbenzene Sulfonic acid (DDBSA) | 0.002 wt. % |
| Polyoxyethylene Nonylphenol (Tergitol NP 9) | 0.002 wt. % |
| Methane Sulfonic Acid (MSA) 70% | 0.00 wt. % |
| Chloride ion | 85-95 ppm |
| Water (Deionized) | Balance |

Monopropylene glycol is preferably included to inhibit premature sludge formation in the adhesion promoting composition bath.

6. Rinse the coupons in warm water (tap water or deionized) for 30 seconds.
7. Air dry the coupons at ambient temperature or up to about 35-40° C., for between 30 seconds to 5 minutes, as needed.

The copper coupons treated in this manner were inspected for coating appearance and defects prior to lamination to a standard phenolic filled, halogen-free and/or polyimide prepreg laminate. Useful phenolic filled dielectrics include those sold under the trade designations Isola 370H, FR408HR, and Isola IS 410. Useful halogen free, high glass transition temperature dielectrics include DE 156 and DE 155, while useful polyimides include Isola P95 and P96.

Example 3

Novel Conditioning Step Followed by Adhesion Promotion Process

Multiple adhesion promotion processes were carried out on test copper coupons using commercially available microetchant, cleaner, and adhesion promotion compositions. These processes, designated A1, were control processes and were carried out in order to provide comparative data for peel strength, conversion coating appearance, and number of solder dip cycles to delamination. The A1 control processes were carried out in a similar manner to the A0 control processes of Example 2, except that the copper coupons were contacted with a pre-dip composition prior to contact with the adhesion promotion composition.

The adhesion promotion processes were carried out on three sets of 1" (25.4 mm) by 2" (50.8 mm) copper coupons according to the following protocol:

1. Contact the surfaces of three copper coupons with microetchant Enthone® PC-7077 (40-60% concentration, available from Enthone Inc.) by immersion or spraying the coupons in or with the microetchant composition for 30 to 45 seconds at a solution temperature between of 27° C.±3° C.
2. Rinse the coupons in warm water (tap water or deionized) for 30 seconds.
3. Contact the etched surfaces of the three copper coupons with a novel alkaline cleaner/conditioner Enthone® (SAM8-R1-10 to 15% concentration) by immersion or spraying the coupons in or with the alkaline cleaner composition for 60 seconds at a solution temperature between of 43° C.±6° C. SAM8R-1 has the following composition:

TABLE 1

Formulation of Alkaline Cleaner Conditioner (SAM8R-10 or XRD111901) as CONTROL

| Items # | Raw Materials | % By wt | Gm/L |
|---|---|---|---|
| 1 | Di Water | 89.75 | 908 |
| 2 | Dowano DB (Diethtylene Glycol Butyl Ether) | 1.86 | 19 |
| 3 | Caustic Potash 50% (Potassium Hydroxide Liq.) | 0.5 | 5.06 |
| 4 | SAM #4 (6-Benzyl Amino Purine) | 0.025 | 0.253 |
| 5 | KI (Potassium Iodide) | 0.01 | 0.1 |
| 6 | Niaproof 08 | 0.005 | 0.05 |
| 7 | MEA (Monoethanolamine) | 1.5 | 15.2 |
| 8 | Caustic Soda 50% Liq. (Sodium Hydroxide) | 6.25 | 63.22 |
| 9 | ZAC (Zinc Ammonium Carbonate Liq.) SPG: 1.01-1.008 (8.430 lb/gal) | 0.1 | 1.01 |

4. Rinse the coupons in warm water (tap water or deionized) for 30 seconds.
5. Contact the cleaned and etched surfaces of the copper coupons with a pre-dip composition comprising sodium bicarbonate ($Na_2CO_3.H_2O$, 30 grams/Liter) for 60 seconds at a solution temperature between of 43° C.±6° C.
6. Rinse the coupons in warm deionizied water for 30 seconds. The water was allowed to drain from the coupons for 10 to 20 seconds to avoid unnecessary dilution of the adhesion promotion composition.
7. Contact the cleaned and etched surfaces of the three copper coupons with adhesion promotion composition AlphaPREP® PC-7030 (100% concentration, available from Enthone Inc.) by immersion or spraying the coupons in or with the adhesion promotion composition. One set of coupons was contacted with AlphaPREP® PC-7030M-1 for 45 seconds. One set of coupons was contacted with AlphaPREP® PC-7030 for 1 minute. One set of coupons was contacted with AlphaPREP® PC-7030M for 2 minutes. The solution temperature between of 43° C.±6° C. The adhesion promotion composition contained the following components and concentrations:

| Component | Concentration |
|---|---|
| $H_2O_2$ | 7.2 wt. % |
| $H_2SO_4$ | 28.0 wt. % |
| $HNO_3$ | 5.0 wt. % |
| 1,2,3-Benzotriazole | 1.0 wt. % |
| Triethylene glycol | 0.9 wt. % |
| Mono-propylene Glycol | 0.5 wt. % |
| 2-ethyoxosulfonate (Niaproof 08) | 0.15 wt. % |
| Dodecylbenzene Sulfonic acid (DDBSA) | 0.002 wt. % |
| Polyoxyethylene Nonylphenol (Tergitol NP 9) | 0.002 wt. % |
| Methane Sulfonic Acid 70% | 2.00 wt. % |
| Chloride ion | 85-95 ppm |
| Water (Deionized) | Balance |

8. Rinse the coupons in warm water (tap water or deionized) for 30 seconds.
9. Air dry the coupons at ambient temperature or up to about 35-40° C., for between 30 seconds to 5 minutes, as needed.

The copper coupons treated in this manner were inspected for coating appearance and defects prior to lamination to a standard epoxy or novolac resin.

Example 4

Adhesion Promotion Process with
6-Benzylaminopurine Conditioning Step

Multiple adhesion promotion processes were carried out on test copper coupons. These processes, designated A3, were carried out according to the method of the present invention. In these processes, the copper coupons were pre-dipped in a composition comprising a molecular capable of forming a self-assembled monolayer on a copper surface. Additionally, the adhesion promotion composition was further modified with polypropylene glycol.

The adhesion promotion processes were carried out on three sets of 1" (25.4 mm) by 2" (50.8 mm) copper coupons according to the following protocol:
1. Contact the surfaces of three copper coupons with microetchant Enthone® PC-7077 (40-60% concentration, available from Enthone Inc.) by immersion, spraying or both, the coupons in or with the microetchant composition for 30 to 45 seconds at a solution temperature between of 27° C.±3° C.
2. Rinse the coupons in warm water (tap water or deionized) for 30 seconds.
3. Contact the etched surface of the three copper coupons with alkaline cleaner Enthone® PC-7096 (10 to 15% concentration, available from Enthone Inc.) by immersing or spraying the coupons in or with the alkaline cleaner composition for 60 seconds at a solution temperature between of 43° C.±6° C.
4. Rinse the coupons in warm water (tap water or deionized) for 30 seconds.
5. Contact the cleaned and etched surfaces of the copper coupons with a pre-dip composition comprising 6-benzylamino purine (5 grams/Liter, available from KingChem or Aldrich Chemicals for 60 seconds at a solution temperature between of 43° C.±6° C.
6. Rinse the coupons in warm deionizied water for 30 seconds. The water was allowed to drain from the coupons for 10 to 20 seconds to avoid unnecessary dilution of the adhesion promotion composition.
7. Contact the cleaned and etched surfaces of the three copper coupons with adhesion promotion composition. AlphaPREP® PC-7030M (100% concentration, available from Enthone Inc.) modified by adding polypropylene glycol or propylene glycol (0.5 to 1.0 wt. %) by immersing or spraying the coupons in or with the adhesion promotion composition. One set of coupons was contacted with AlphaPREP® PC-7030 for 45 seconds. One set of coupons was contacted with AlphaPREP® PC-7030 for 1 minute. One set of coupons was contacted with AlphaPREP® PC-7030 for 2 minutes. The solution temperature between of 43° C.±6° C. The adhesion promotion composition contained the following components and concentrations:

| Component | Concentration |
|---|---|
| $H_2O_2$ | 7.2 wt. % |
| $H_2SO_4$ | 28.0 wt. % |
| $HNO_3$ | 5.0 wt. % |
| 1,2,3-Benzotriazole | 1.0 wt. % |
| Triethylene glycol | 0.9 wt. % |
| Polypropylene glycol | 0.5 to 1.0 wt. % |
| 2-ethyoxosulfonate (Niaproof 08) | 0.15 wt. % |
| Dodecylbenzene Sulfonic acid (DDBSA) | 0.002 wt. % |
| Polyoxyethylene Nonylphenol (Tergitol NP 9) | 0.002 wt. % |
| Methane Sulfonic Acid (MSA) 70% | 0.00 |
| Chloride ion | 85-95 ppm |
| Water (Deionized) | Balance |

8. Rinse the coupons in warm water (tap water or deionized) for 30 seconds.
9. Air dry the coupons at ambient temperature or up to about 35-40° C., for between 30 seconds to 5 minutes, as needed.

The copper coupons treated in this manner were inspected for coating appearance and defects prior to lamination to a standard FR4 pre-preg laminate available under the trade designation Isola FR4, Panasonic 155 plus, Nanya 170 or Nanya 175.

Example 5

Adhesion Promotion Process Using
6-Benzylaminopurine Conditioner

Multiple adhesion promotion processes were carried out on test copper coupons. These processes, designated A6, were carried out according to the method of the present invention. In these processes, the copper coupons were pre-dipped in a composition comprising a molecular capable of forming a self-assembled monolayer on a copper surface. Additionally, the adhesion promotion composition was further modified with methane-sulfonic acid.

The adhesion promotion processes were carried out on three sets of 1" (25.4 mm) by 2" (50.8 mm) copper coupons according to the following protocol:
1. Contact the surfaces of three copper coupons for 30 to 45 seconds with microetchant Enthone® PC-7077 (40-60% concentration, available from Enthone Inc.) by immersion, spraying or both, while maintaining the solution temperature between of 27° C.±3° C.
2. Rinse the coupons in warm water (tap water or deionized) for 30 seconds.
3. Contact the etched surface of the three copper coupons with alkaline cleaner Enthone® SAME-R1 (10 to 15% concentration, available from Enthone Inc.) by immersion, spraying or both, the coupons in or with the alkaline cleaner/Conditioner composition for 60 seconds at a solution temperature between of 43° C.±6° C.

4. Rinse the coupons in warm water (tap water or deionized) for 30 seconds.
5. Contact the cleaned and etched surfaces of the copper coupons with a pre-dip composition comprising 6-benzylamino purine (5 grams/Liter), available from KingChem or Aldrich Chemical for 60 seconds at a solution temperature between of 43° C.±6° C.
6. Rinse the coupons in warm deionizied water for 30 seconds. The water was allowed to drain from the coupons for 10 to 20 seconds to avoid unnecessary dilution of the adhesion promotion composition.
7. Contact the cleaned and etched surfaces of the three copper coupons with adhesion promotion composition AlphaPREP® PC-7030 (100% concentration, available from Enthone Inc.) modified by adding methanesulfonic acid (2 wt. %), so that the solution contained nitric, sulfuric and methanesulfonic acids, and immersing or spraying the coupons in or with the adhesion promotion composition. One set of coupons was contacted with AlphaPREP® PC-7030 for 45 seconds. One set of coupons was contacted with AlphaPREP®PC-7030 for 1 minute. One set of coupons was contacted with AlphaPREP® PC-7030 for 2 minutes. The solution temperature was 43° C.±6° C. The adhesion promotion composition contained the following components and concentrations:

| Component | Concentration |
| --- | --- |
| $H_2O_2$ | 7.2 wt. % |
| $H_2SO_4$ | 28.0 wt. % |
| $HNO_3$ | 5.0 wt. % |
| $CH_3SO_4H$ | 2.0 wt. % |
| 1,2,3-Benzotriazole | 1.0 wt. % |
| Triethylene glycol | 0.9 wt. % |
| 2-ethyoxosulfonate (Niaproof 08) | 0.15 wt. % |
| Dodecylbenzene Sulfonic acid (DDBSA) | 0.002 wt. % |
| Polyoxyethylene Nonylphenol (Tergitol NP 9) | 0.002 wt. % |
| Chloride ion | 85-95 ppm |
| Water (Deionized) | Balance |

8. Rinse the coupons in warm water (tap water or deionized) for 30 seconds.
9. Air dry the coupons at ambient temperature or up to about 35-40° C., for between 30 seconds to 5 minutes, as needed.

The copper coupons treated in this manner were inspected for coating appearance and defects prior to lamination to a standard FR4 pre-preg laminate available under the trade designation Isola 370 FR, Isola FR408HR or Isola Is410.

Example 6

Adhesion Promotion Process

Multiple adhesion promotion processes were carried out on test copper coupons. These processes, designated A7, were carried out according to the method of the present invention. In these processes, the copper coupons were pre-dipped in a composition comprising a molecule capable of forming a self-assembled monolayer on a copper surface. Additionally, the adhesion promotion composition was further modified with methanesulfonic acid and polypropylene glycol.

The adhesion promotion processes were carried out on three sets of 1" (25.4 mm) by 2" (50.8 mm) copper coupons according to the following protocol:
1. Contact the surfaces of three copper coupons with microetchant Enthone® PC-7077 (40-60% concentration, available from Enthone Inc.) by immersion, spraying or both, the coupons in the microetchant composition for 30 to 45 seconds at a solution temperature between of 27° C.±3° C.
2. Rinse the coupons in warm water (tap water or deionized) for 30 seconds.
3. Contact the etched surface of the three copper coupons with alkaline cleaner Enthone® PC-7096 (10 to 15% concentration, available from Enthone Inc.) by immersion, spraying or both, the coupons in or with the alkaline cleaner composition for 60 seconds at a solution temperature between of 43° C.±6° C.
4. Rinse the coupons in warm water (tap water or deionized) for 30 seconds.
5. Contact the cleaned and etched surfaces of the copper coupons with a pre-dip composition comprising 6-benzylamino purine (5 grams/Liter, available from KingChem or Aldrich for 60 seconds at a solution temperature between of 43° C.±6° C.
6. Rinse the coupons in warm deionizied water for 30 seconds. The water was allowed to drain from the coupons for 10 to 20 seconds to avoid unnecessary dilution of the adhesion promotion composition.
7. Contact the cleaned and etched surfaces of the three copper coupons with adhesion promotion composition AlphaPREP® PC-7030 (100% concentration, available from Enthone Inc.) modified by adding polypropylene glycol (0.5 to 1.0 wt. %) having an average molecular weight 76.1 g/mol, available from KingChem or Aldrich Chemical, and by adding methanesulfonic acid (2 wt. %), available from Huntsman Corporation thereby producing a solution containing sulfuric, nitric and methanesulfonic acids. The coupons were then immersed in and/or sprayed with the adhesion promotion composition. One set of coupons was contacted with AlphaPREP® PC-7030 for 45 seconds. One set of coupons was contacted with AlphaPREP® PC-7030M for 1 minute. One set of coupons was contacted with AlphaPREP®PC-7030 for 2 minutes. The solution temperature between of 43° C.±6° C. The adhesion promotion composition contained the following components and concentrations:

| Component | Concentration |
| --- | --- |
| $H_2O_2$ | 7.2 wt. % |
| $H_2SO_4$ | 28.0 wt. % |
| $HNO_3$ | 5.0 wt. % |
| $CH_3SO_4H$ | 2.0 wt. % |
| 1,2,3-Benzotriazole | 1.0 wt. % |
| Triethylene glycol | 0.9 wt. % |
| Polypropylene glycol | 0.5 to 1.0 wt. % |
| 2-ethyoxosulfonate (Niaproof 08) | 0.15 wt. % |
| Dodecylbenzene Sulfonic acid (DDBSA) | 0.002 wt. % |
| Polyoxyethylene Nonylphenol (Tergitol NP 9) | 0.002 wt. % |
| Chloride ion | 85-95 ppm |
| Water (Deionized) | Balance |

8. Rinse the coupons in warm water (tap water or deionized) for 30 seconds.
9. Air dry the coupons at ambient temperature or up to about 35-40° C., for between 30 seconds to 5 minutes, as needed.

The copper coupons treated in this manner were inspected for coating appearance and defects prior to lamination to a standard FR4 pre-preg laminate.

Example 7

Adhesion Promotion Process of the Invention

Multiple adhesion promotion processes were carried out on test copper coupons. These processes, designated A8, were carried out according to the method of the present invention. In these processes, the copper coupons were cleaned in an alkaline cleaner composition further comprising a molecular capable of forming a self-assembled monolayer on a copper surface. Additionally, the adhesion promotion composition was further modified with methanesulfonic acid and polypropylene glycol.

The adhesion promotion processes were carried out on three sets of 1" (25.4 mm) by 2" (50.8 mm) copper coupons according to the following protocol:

1. Contact the surfaces of three copper coupons with microetchant Enthone® PC-7077 (40-60% concentration, available from Enthone Inc.) by spraying the coupons in the microetchant composition for 30 to 45 seconds, or immersing them with the solution, in either case at a solution temperature between of 27° C.±3° C.
2. Rinse the coupons in warm water (tap water or deionized) for 30 seconds.
3. Contact the etched surface of the three copper coupons with alkaline cleaner Enthone® SAM8-R1 (10 to 15% concentration, available from Enthone Inc.) further comprising 6-benzylamino purine (5 grams/Liter) by immersing the coupons in the alkaline cleaner composition for 60 seconds, or spraying them with the composition, in either case at a solution temperature between of 43° C.±6° C.
4. Rinse the coupons in warm water (tap water or deionized) for 30 seconds. The water was allowed to drain from the coupons for 10 to 20 seconds to avoid unnecessary dilution of the adhesion promotion composition.
5. Contact the cleaned and etched surfaces of the three copper coupons with adhesion promotion composition AlphaPREP® PC-7030 (100% concentration, available from Enthone Inc.) modified by adding polypropylene glycol (0.5 wt. %) having a molecular weight of 76.1 g/mol, and by adding methanesulfonic acid (2 wt. %) so that the composition contained sulfuric, nitric and methanesulfonic acid. Contact was by immersion or spraying or both. One set of coupons was contacted with AlphaPREP® PC-7030M for 45 seconds. One set of coupons was contacted with AlphaPREP® PC-7030 for 1 minute. One set of coupons was contacted with AlphaPREP® PC-7030 for 2 minutes. The solution temperature was 43° C.±6° C. The adhesion promotion composition contained the following components and concentrations:

| Component | Concentration |
| --- | --- |
| $H_2O_2$ | 7.2 wt. % |
| $H_2SO_4$ | 28.0 wt. % |
| $HNO_3$ | 5.0 wt. % |
| $CH_3SO_4H$ | 2.0 wt. % |
| 1,2,3-Benzotriazole | 1.0 wt. % |
| Triethylene glycol | 0.9 wt. % |
| Polypropylene glycol | 0.5 wt. % |
| 2-ethyoxosulfonate (Niaproof 08) | 0.15 wt. % |
| Dodecylbenzene Sulfonic acid (DDBSA) | 0.002 wt. % |
| Polyoxyethylene Nonylphenol (Tergitol NP 9) | 0.002 wt. % |
| Chloride ion | 85-95 ppm |
| Water (Deionized) | Balance |

6. Rinse the coupons in warm water (tap water or deionized) for 30 seconds.
7. Air dry the coupons at ambient temperature or up to about 35-40° C., for between 30 seconds to 5 minutes, as needed.

The copper coupons treated in this manner were inspected for coating appearance and defects prior to lamination to a standard FR4 pre-preg laminate.

Example 8-14

Adhesion Promotion Process

Multiple adhesion promotion processes were carried out on test copper coupons that were designated B0S, B0, B1, B3, B6, B7, and B8. Adhesion promotion processes B0S, B0, B1, B3, B6, B7, and B8 were identical to process A0S, A0, A1, A3, A6, A7, and A8, respectively, except that in each of B0S, B0, B1, B3, B6, B7, and B8, the adhesion promotion compositions were formulated with 30 g/L copper ions. in order to simulate a working adhesion promotion process in which the adhesion promotion composition has accumulated a substantial copper ion concentration.

Example 15

Lamination Process

The copper coupons treated as described in Examples 1 through 14 were laminated to a standard FR4 pre-preg laminate at 188° C. of the type available under the trade designation Isola 370HR, Isola IS410, Nanya 170, Nanya 175 or Panasonci R1551, according to the following protocol:

1. One surface of the copper coupon and one surface of the pre-preg were each coated by a DuPont™ Tedlar® PVF Film.
2. The opposite, uncoated sides of the copper coupon and pre-preg were placed in contact with each other.
3. The Tedlar® coated sides were then contacted with platens and compressed together in a hydraulic press at about 765 kPa (about 111 PSI) for 5 minutes.
4. The pressure was increased to 1436 kPa (about 208.33 PSI) for 10 minutes.
5. The pressure was increased to 1917 kPa (about 211 PSI) for 60 minutes.
6. The pressure was decreased to 1436 kPa (about 208.33 PSI) for 5 minutes.

The copper coupon coated pre-pregs were then subjected to solder pot dip tests and peel strength tests.

The solder pot dip test is conducted by lowering a portion of the copper laminated pre-preg into molten solder at a temperature of 260° C. for 10 second interval cycles. The number of cycles until delamination is recorded.

Peel strength is determined with the Instron 4442 Instrument (ASTM standard). The peel strength is run on five samples.

Additionally, the etch rate of copper in the adhesion promotion composition was determined by measuring the copper ion concentration in the adhesion promotion composition.

The empirical results are summarized in the following Tables 1 through 3:

TABLE 1

Empirical Data for Copper Coupons Treated in Adhesion Promotion Composition for Two Minutes

| Designation | Copper weight Loss (grams $Cu^{2+}$) | Etch Rate (μm/min) | Total Etch (μm) | Peel Strength (N/M) | Appearance | Solder Dip (Cycles to Delamination) |
|---|---|---|---|---|---|---|
| A0S | 0.083 | 1.79 | 3.58 | 301.9 | 3 | 16 |
| B0S | 0.077 | 1.67 | 3.33 | 942.15 | 4 | 15 |
| A0 | 0.050 | 1.08 | 2.15 | 1165.6 | 3 | 17 |
| B0 | 0.049 | 1.06 | 2.13 | 1092.8 | 4 | 16 |
| A1 | 0.048 | 1.03 | 2.07 | 1040.2 | 3 | 17 |
| B1 | 0.039 | 0.83 | 1.66 | 1075.2 | 4 | 17 |
| A3 | 0.066 | 1.50 | 3.00 | 1372.9 | 5 | 23 |
| B3 | 0.069 | 1.48 | 2.96 | 1339.7 | 5 | 24 |
| A6 | 0.044 | 0.95 | 1.89 | 959.7 | 3 | 20 |
| B6 | 0.042 | 0.90 | 1.80 | 991.2 | 4 | 22 |
| A7 | 0.065 | 1.39 | 2.79 | 1162.8 | 4 | 29 |
| B7 | 0.060 | 1.30 | 2.60 | 1126.0 | 5 | 28 |
| A8 | 0.066 | 1.43 | 2.86 | 1204.8 | 4 | 31 |
| B8 | 0.063 | 1.35 | 2.71 | 1210.1 | 5 | 30 |

TABLE 2

Empirical Data for Copper Coupons Treated in Adhesion Promotion Composition for One Minute

| Designation | Copper weight Loss (grams $Cu^{2+}$) | Etch Rate (μm/min) | Total Etch (μm) | Peel Strength (N/M) | Appearance | Solder Dip (Cycles to Delamination) |
|---|---|---|---|---|---|---|
| A0S | 0.040 | 1.7 | 1.7 | 795.1 | 2 | 12 |
| B0S | 0.032 | 1.39 | 1.39 | 872.1 | 3 | 13 |
| A0 | 0.026 | 1.11 | 1.11 | 866.8 | 3 | 14 |
| B0 | 0.026 | 1.13 | 1.13 | 882.6 | 3 | 16 |
| A1 | 0.024 | 1.04 | 1.04 | 882.6 | 3 | 14 |
| B1 | 0.022 | 0.96 | 0.96 | 889.6 | 3 | 15 |
| A3 | 0.033 | 1.43 | 1.43 | 924.6 | 4 | 29 |
| B3 | 0.033 | 1.43 | 1.43 | 900.1 | 4 | 30 |
| A6 | 0.033 | 0.93 | 0.93 | 812.6 | 3 | 19 |
| B6 | 0.022 | 0.93 | 0.93 | 826.6 | 3 | 18 |
| A7 | 0.032 | 1.39 | 1.39 | 886.1 | 4 | 24 |
| B7 | 0.034 | 1.47 | 1.47 | 849.3 | 4 | 25 |
| A8 | 0.033 | 1.42 | 1.42 | 914.1 | 4 | 32 |
| B8 | 0.034 | 1.47 | 1.47 | 882.6 | 4 | 33 |

TABLE 3

Empirical Data for Copper Coupons Treated in Adhesion Promotion Composition for 45 Seconds

| Designation | Copper weight Loss (grams $Cu^{2+}$) | Etch Rate (μm/min) | Total Etch (μm) | Peel Strength (N/M) | Appearance | Solder Dip (Cycles to Delamination) |
|---|---|---|---|---|---|---|
| A0S | 0.029 | 1.66 | 1.25 | 711.7 | 2 | 8 |
| B0S | 0.025 | 1.43 | 1.07 | 690.0 | 2 | 9 |
| A0 | 0.019 | 1.1 | 0.82 | 791.5 | 2 | 10 |
| B0 | 0.018 | 1.03 | 0.77 | 837.1 | 3 | 12 |
| A1 | 0.018 | 1.04 | 0.78 | 749.5 | 3 | 9 |
| B1 | 0.014 | 0.80 | 0.60 | 705.7 | 3 | 9 |
| A3 | 0.025 | 1.44 | 1.08 | 866.8 | 5 | 20 |
| B3 | 0.026 | 1.50 | 1.13 | 854.6 | 5 | 21 |
| A6 | 0.016 | 0.03 | 0.02 | 698.7 | 3 | 9 |
| B6 | 0.018 | 1.01 | 0.76 | 693.5 | 3 | 10 |
| A7 | 0.025 | 1.44 | 1.08 | 819.5 | 4 | 26 |
| B7 | 0.024 | 1.40 | 1.05 | 852.8 | 4 | 25 |
| A8 | 0.024 | 1.37 | 1.03 | 872.1 | 4 | 30 |
| B8 | 0.026 | 1.47 | 1.11 | 849.3 | 4 | 32 |

In the above tables, "Appearance" is a qualitative, eyeball measurement of the appearance of the organometallic conversion coating. A rating of 5 means that the coating was an excellent dark brown color that the industry associates with a strongly adhesive coating. A 4 rating means that the coating was good, uniform, and dark reddish brown. A 3 rating means that the coating was fairly uniform and still dark brown, but less so than a 4 or 5. Ratings of 1 or 2 mean that the coating was uneven; the dark reddish brown color was spotty.

The results of the various adhesion promotion processes as set out in Tables 1 through 3 indicate that the incorporation of propylene glycol or polypropylene glycol in the adhesion promotion composition in addition to a pre-dip in a composition comprising a molecule capable of forming a self-assembled monolayer on a copper surface improves the overall performance of the adhesion process. Advantageous results achieved include an improvement in the appearance of the organometallic conversion coating, an increase in peel strength, and an increase in the number of solder dip cycles prior to delamination. In some respects, the adhesion promotion process was improved when compositions comprising a substantial copper load were employed. It may therefore be concluded that an adhesion promotion composition can be used for an extended duration when copper coupons are pre-dipped in a composition comprising a molecule capable of forming a self-assembled monolayer.

Example 16

Adhesion Promoting Process

Multiple adhesion promotion processes were carried out on test copper coupons. These processes were carried out according to the method of the present invention. In these processes, the copper coupons were pre-dipped in a composition comprising a molecular capable of forming a self-assembled monolayer on a copper surface. Additionally, the adhesion promotion composition was further modified with polypropylene glycol.

The adhesion promotion processes were carried out on three sets of 1" (25.4 mm) by 2" (50.8 mm) copper coupons according to the following protocol:

1. Contact the surfaces of three copper coupons with microetchant Enthone® PC-7077 (40-60% concentration, available from Enthone Inc.) by immersion, spraying or both, the coupons in the microetchant composition for 30 to 45 seconds at a solution temperature between of 27° C.±3° C.
2. Rinse the coupons in warm water (tap water or deionized) for 30 seconds.
3. Contact the etched surface of the three copper coupons with alkaline cleaner Enthone® PC-7096 (10 to 15% concentration, available from Enthone Inc.) by immersing or spraying the coupons in the alkaline cleaner composition for 60 seconds at a solution temperature between of 43° C.±6° C.
4. Rinse the coupons in warm water (tap water or deionized) for 30 seconds.
5. Contact the cleaned and etched surfaces of the copper coupons with a pre-dip composition having the following composition:

| Code | Raw Material Name | % by Weight in Formulation | Quantity/Units |
|---|---|---|---|
| 803313 | WATER, DEIONIZED | 92.808 | 0.942 |
| 803430 | Potassium Hydroxide 45% Soln | 0.552 | 0.0056 |
| 804371 | SODIUM HYDROXIDE PEARLS | 3.113 | 0.0316 |
| 804763 | NIAPROOF ANIONIC 08 | 0.005 | 0.05 |
| 809469 | 6-BENZYLAMINOPURINE (BAP) | 0.025 | 0.253 |
| 809470 | ZINPLEX 15 | 0.121 | 1.23 |
| 805507 | POTASSIUM IODIDE AR | 0.010 | 0.1 |
| 803203 | MONOETHANOLAMINE | 1.498 | 0.0152 |
| 804329 | BUTYL DIGLYCOL/BUTYL CARBITOL | 1.872 | 0.019 |
| | | 100.003 | |
| | Specific Gravity | 1.015 | |

The cleaned and etched coupons were contacted with this conditioning solution for 60 seconds at a solution temperature between of 43° C.±6° C.

6. Rinse the coupons in warm deionizied water for 30 seconds. The water was allowed to drain from the coupons for 10 to 20 seconds to avoid unnecessary dilution of the adhesion promotion composition.

Contact the cleaned and etched surfaces of the three copper coupons with adhesion promotion composition having the composition (specific gravity 1.13):

| # OF RAWS | RAW MAT'L CODE | RAW MAT'L NAME | WT % | Quantity in Gram |
|---|---|---|---|---|
| 1 | 803313 | DI WATER | 55.59 | 628.17 |
| 2 | 803236 | Calsoft Las 99 | 0.00 | 0.02 |
| 3 | 803382 | Tergitol NP9 | 0.00 | 0.02 |
| 4 | 804763 | Niaproof 08 | 0.15 | 1.70 |
| 5 | 803461 | Nitric Acid | 5.00 | 56.50 |
| 6 | 803679 | Benzotriazole cobratec 99 | 1.00 | 11.30 |
| 7 | 801051 | Hydrogen Peroxde (35%) | 7.20 | 81.36 |
| 8 | 803257 | Sulfuric Acid (50%) | 28.00 | 316.40 |
| 9 | 803046 | Triethylene Glycol | 0.90 | 10.17 |
| 10 | 804699 | Zinc Sulfate Monohydrate | 0.16 | 1.79 |

The solution temperature during contact of the adhesion promoting solution with the coupons was between 43° C.±6° C. In repetitive operations using this adhesion promoting bath, the copper capacity reached >40 g/L. After lamination in the manner described hereinabove, High Tg Phenolic cured laminates achieved a peel strength of 690, N/m and survived 10× IR reflow without delamination. Panasonic 1551 halogen-free laminates achieved an initial peel strength of 835 N/m which remained at 755 N/m after 10× IR reflow; Nanya NPG 170 halogen free laminates achieved an initial peel strength of 733 N/m which increased to 784 N/m after 10× IR reflow. ISOLA 370 laminates achieved an initial peel strength of 835 to 890 N/m which remained at 770 to 850 N/m after 10× IR reflow.

Example 17

Tests at Varying Copper Levels

In accordance with the method of the invention, multiple adhesion promotion tests were carried out on copper coupons.

The coupons were micro-etched, rinsed, cleaned, rinsed again in the manner described above, and then immersed for either 60 or 120 seconds at 43±6° C. in one of two different conditioning solutions, either Conditioner #1 or Conditioner #2. Conditioner #1 contained 6-benzylaminopurine and generally corresponded to the formulation set out for the conditioner used in Example 3, above. Conditioner #2 contained 6-benzylaminopurine and Zinplex, and generally corresponded to the conditioner composition used in Example 16.

The coupons were thereafter rinsed, drained and contacted with an adhesion promoting composition.

A control (Experiment #7) was run using the adhesion promoting solution of Example 16 after conditioning only with a standard alkaline cleaning solution.

After treatment with the adhesion promoting solution, the coupons were laminated to a dielectric material generally in the manner described above. In some instances, the lamination took place after 10×IR-reflow, and in other cases lamination was conducted before reflow.

After the lamination step, the laminated composites were subjected to peel strength tests as described above. The peel strength results for the coupons laminated before reflow are set forth in Table 5 and the results for coupons laminated after reflow are set forth in Table 6.

TABLE 5

| | | | \multicolumn{5}{c|}{As Laminated Before 10× Reflow - ISOLA 370HR Peel Strength} |
|---|---|---|---|---|---|---|---|
| Experiment | Conditioner | Adhesion Promoter | Peel Sample #1 | Peel Sample #2 | Peel Sample | Peel Sample #4 | Peel Sample #5 |
| 1 | #2, 1 min. | 7030M-1, Ex. 2 | 879 | 813 | 809 | 760 | 781 |
| 2 | #2, 2 mins. | 7030M-1, Ex. 2 | 802 | 809 | 795 | 848 | 802 |
| 3 | #1, 2 mins. | 7030M-1, Ex. 2 | 823 | 799 | 750 | 715 | 697 |
| 4 | #2, 2 mins. | 7030M-1, Ex. 2 | 953 | 900 | 893 | 851 | 840 |
| 5 | #1, 2 mins. | 7030M-1, Ex. 2 | 816 | 805 | 732 | 750 | 736 |
| 6 | #2, 2 mins. | 7030M-1, Ex. 16 | 135 | 217 | 228 | 252 | 214 |
| 7 | Std. alkaline cleaner | standard | 579 | 536 | 536 | 546 | 652 |
| 8 | #1 | Standard | 686.5 | 711 | 722 | 704 | 694 |
| 9 | #2 | standard | 746 | 725 | 750 | 736 | 753 |

TABLE 6

| | | | \multicolumn{5}{c|}{After 10× IR-reflow - ISOLA 370HR Peel Strength} |
|---|---|---|---|---|---|---|---|
| Experiment | Conditioner | Adhesion Promoter | Peel Sample #1 | Peel Sample #2 | Peel Sample | Peel Sample #4 | Peel Sample #5 |
| 1 | #2, 1 min. | 7030M-1, Ex. 2 | 748 | 783 | 805 | 765 | |
| 2 | #2, 2 mins. | 7030M-1, Ex. 2 | 770 | 777 | 766 | 773 | |
| 3 | #1, 2 mins. | 7030M-1, Ex. 2 | 811 | 785 | 759 | 751 | 799 |
| 4 | #2, 2 mins. | 7030M-1, Ex. 2 | 881 | 830 | 865 | 803 | |
| 5 | #1, 2 mins. | 7030M-1, Ex. 2 | 875 | 760 | 902 | 831 | |
| 6 | #2, 2 mins. | 7030M-2, Ex. 16 | 190 | 202 | 229 | 199 | |
| 7 | Std. alkaline cleaner | standard | 525 | 550 | 509 | 519 | |
| 8 | #1 | Standard | 533 | 568 | 582 | 609 | |
| 9 | #2 | standard | 560 | 530 | 601 | 628 | |

Poor results were experienced with the adhesion promotion formulation of Experiment #6, both in the case of lamination before reflow and in the case of lamination after reflow, because of the presence of polyglycol WL-5000 containing 0.1 wt. % butylated hydroxytoluene in the adhesion promoting solution. The presence of these components proved to have a sharply adverse effect on the peel strength.

However, the remaining experiments using either (i) Conditioner #1 (Experiments ##3, 5 and 8) or (ii) Conditioner #2 (Experiments ##1 to 5, 8 and 9) all gave results substantially superior to the control (Experiment #7). A further increment in peel strength was obtained in those experiments using both conditioner #2 and an adhesion promoting solution of Example 16 containing Zn ions (Experiment #4).

Example 18

To simulate commercial operations in which the conditioning and adhesion promoting solutions are subjected to contact with a succession of different copper substrates in repetitive cycles of conditioning, adhesion promoting, and laminating operations, experimental runs were conducted in which the adhesion promoting solution was spiked with copper. Copper was added in proportions that reflect the actual accumulation of copper ions in the adhesion promoting solutions during commercial operations in which each of the two treating formulations is contacted with copper substrates through repetitive cycles. In each run the conditioning step was carried out using a conditioning solution having essentially the composition of Conditioner #2. The conditions of treatment with conditioner and adhesion promoting solution were as otherwise described in Example 17.

In the test runs of this example, the adhesion promoting solution was spiked with either 1, 5, or 10 g/l copper. The treated coupons were then laminated to a dielectric material at either 15.5 or 24.1 bars and peel strength tests conducted on the resulting laminated composites.

Figure 1:
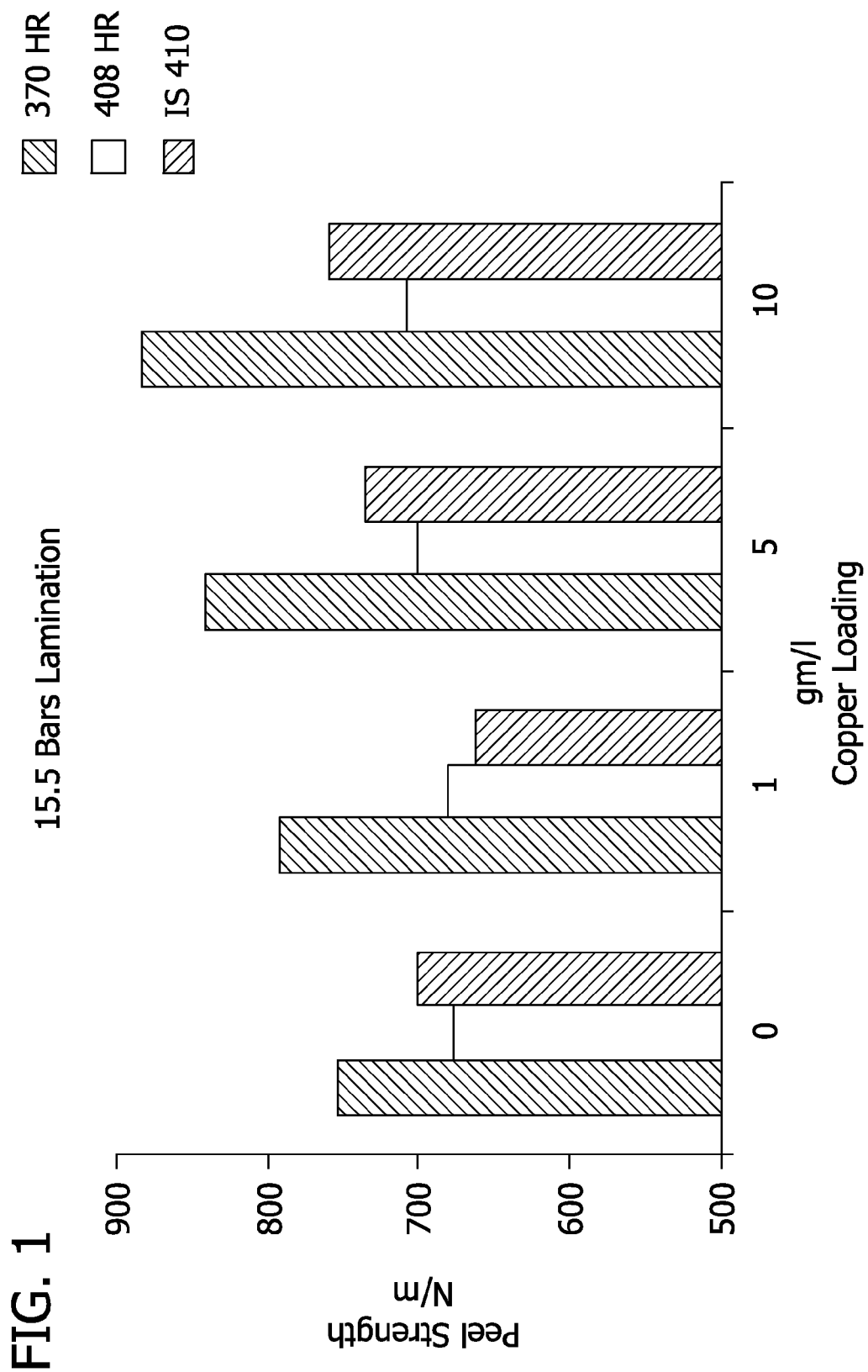
FIG. 1 is a series of bar graphs showing peel strength as a function of copper loading for various laminates prepared at 15.5 bars after treatment with a conditioner and adhesion promoter of the invention as described in Example 18, wherein each of the conditioner and adhesion promoter compositions contained a concentration of copper ion ranging from 0 to 10 g/l.
Figure 2:
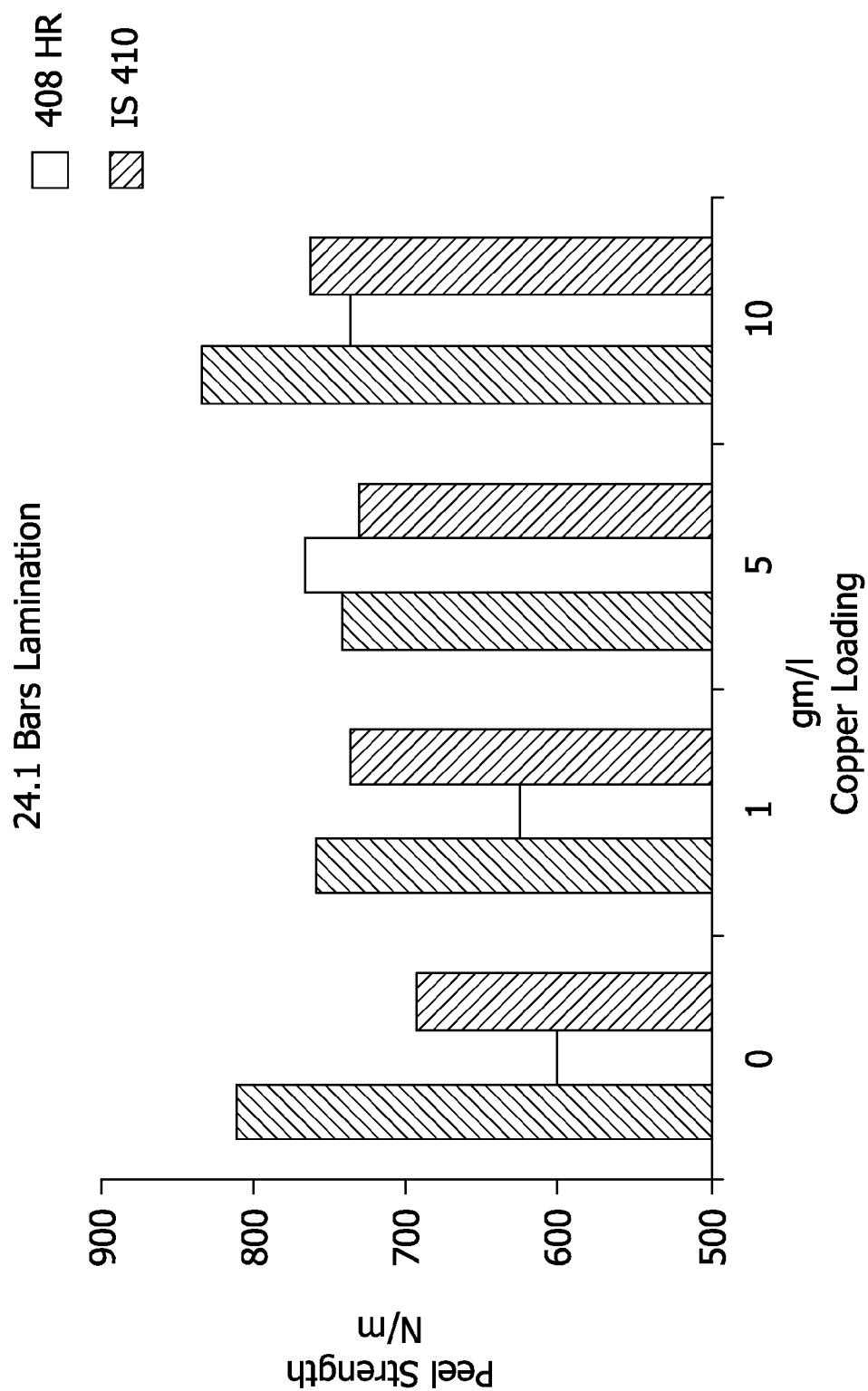
FIG. 2 is a series of bar graphs showing peel strength as a function of copper loading for laminates prepared at 24.1 bars after treatment with a conditioner and adhesion promoter of the invention as further described in Example 18, wherein again each of the conditioner and adhesion promoter compositions contained a concentration of copper ion ranging from 0 to 10 g/l.

The average peel strengths for composites comprising the three different dielectrics are depicted in FIG. 1 for laminates prepared at 15.5 bar and in FIG. 2 for laminates prepared at 24.1 bar.

Example 19

Another series of tests were conducted substantially in the manner described in Example 18.

Three different dielectric materials were used in the experiments of this example, i.e., Isola 370R, 408 HR, and IS 410. With each combination of conditioner and adhesion promoting solution, separate lamination experiments were conducted at laminating pressures of either 15.5 bars or 24.1 bars. Peel strength tests were conducted both before and after reflow.

Figure 3:
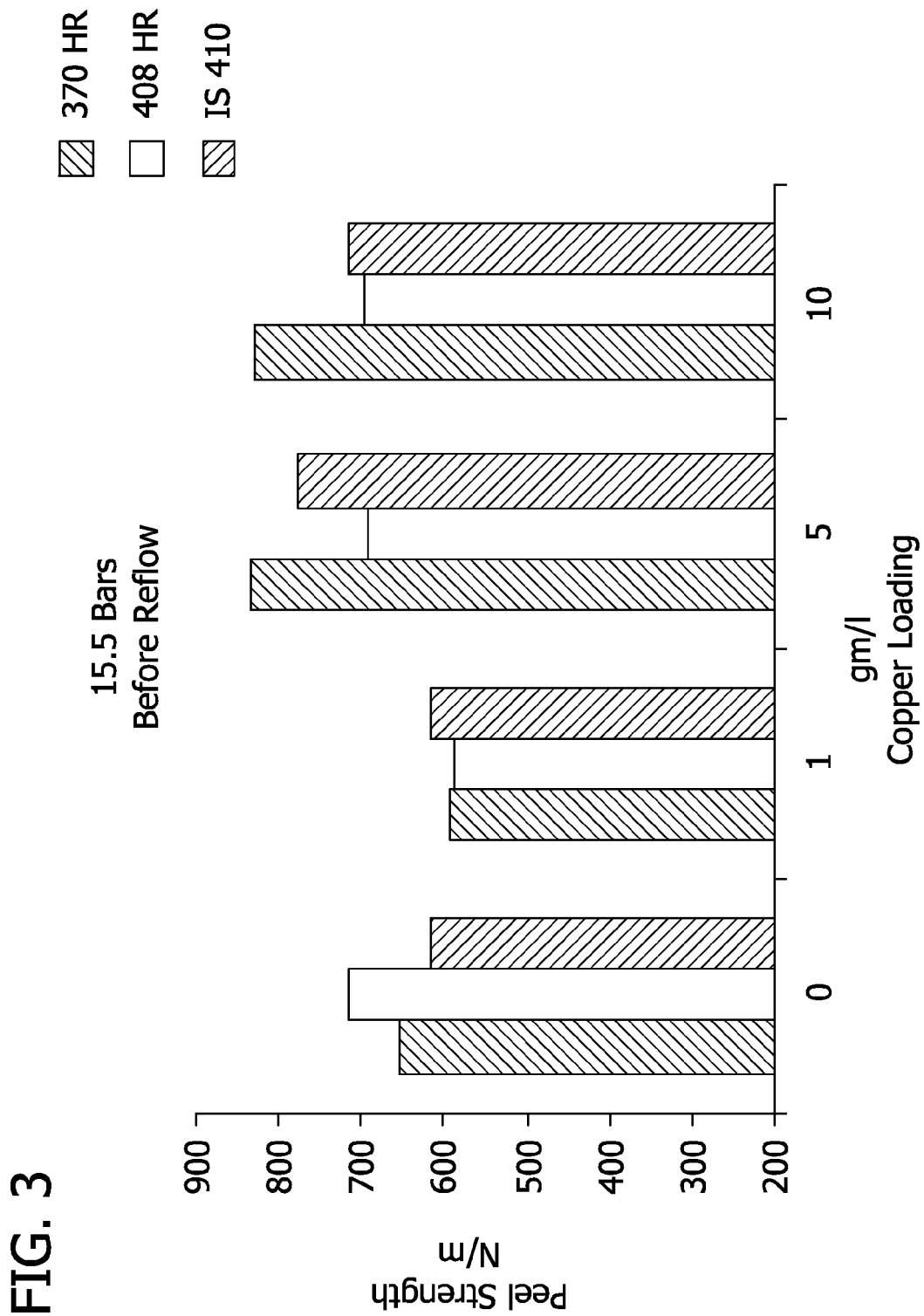
Figure 4:
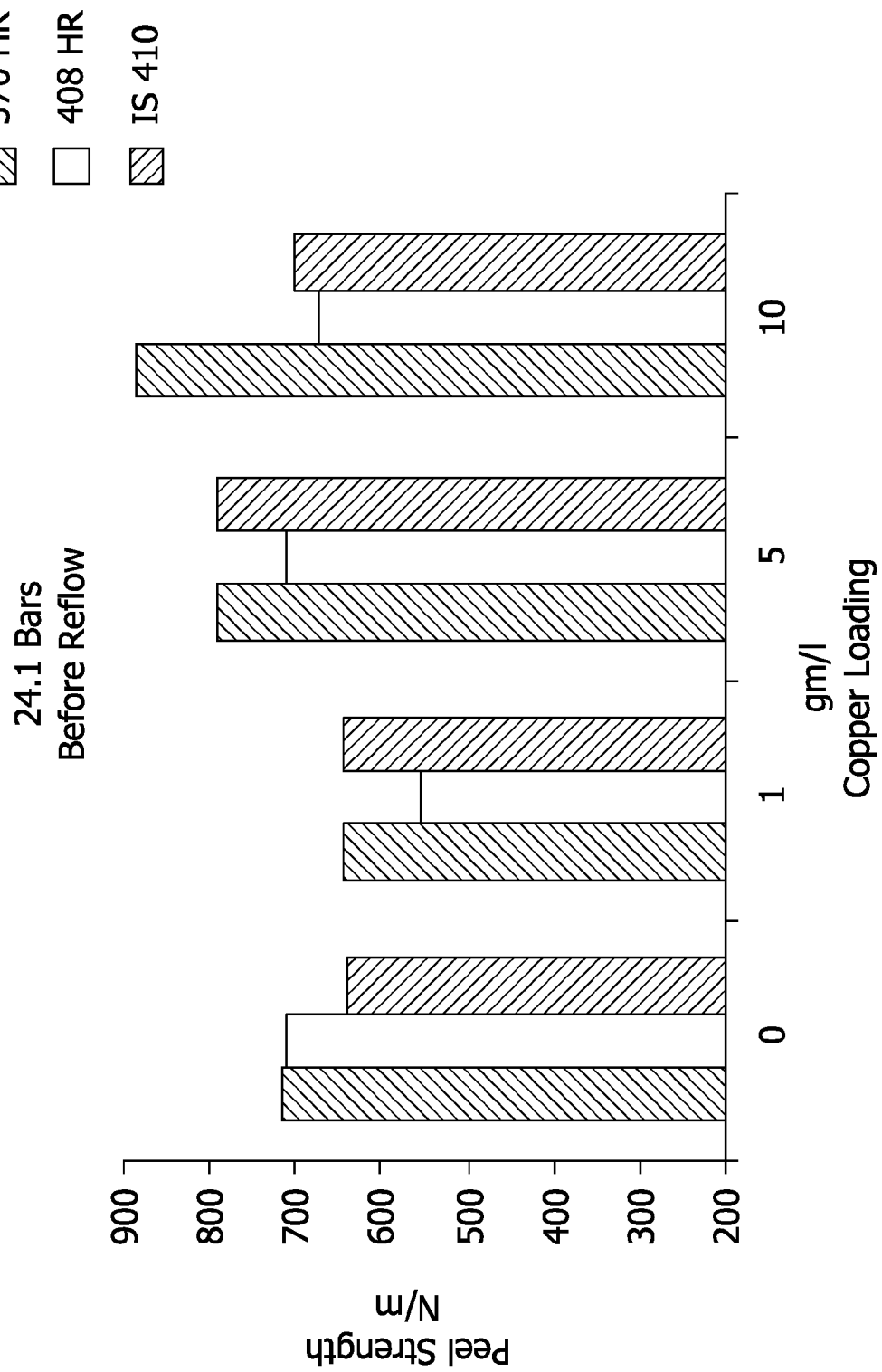
Figure 5:
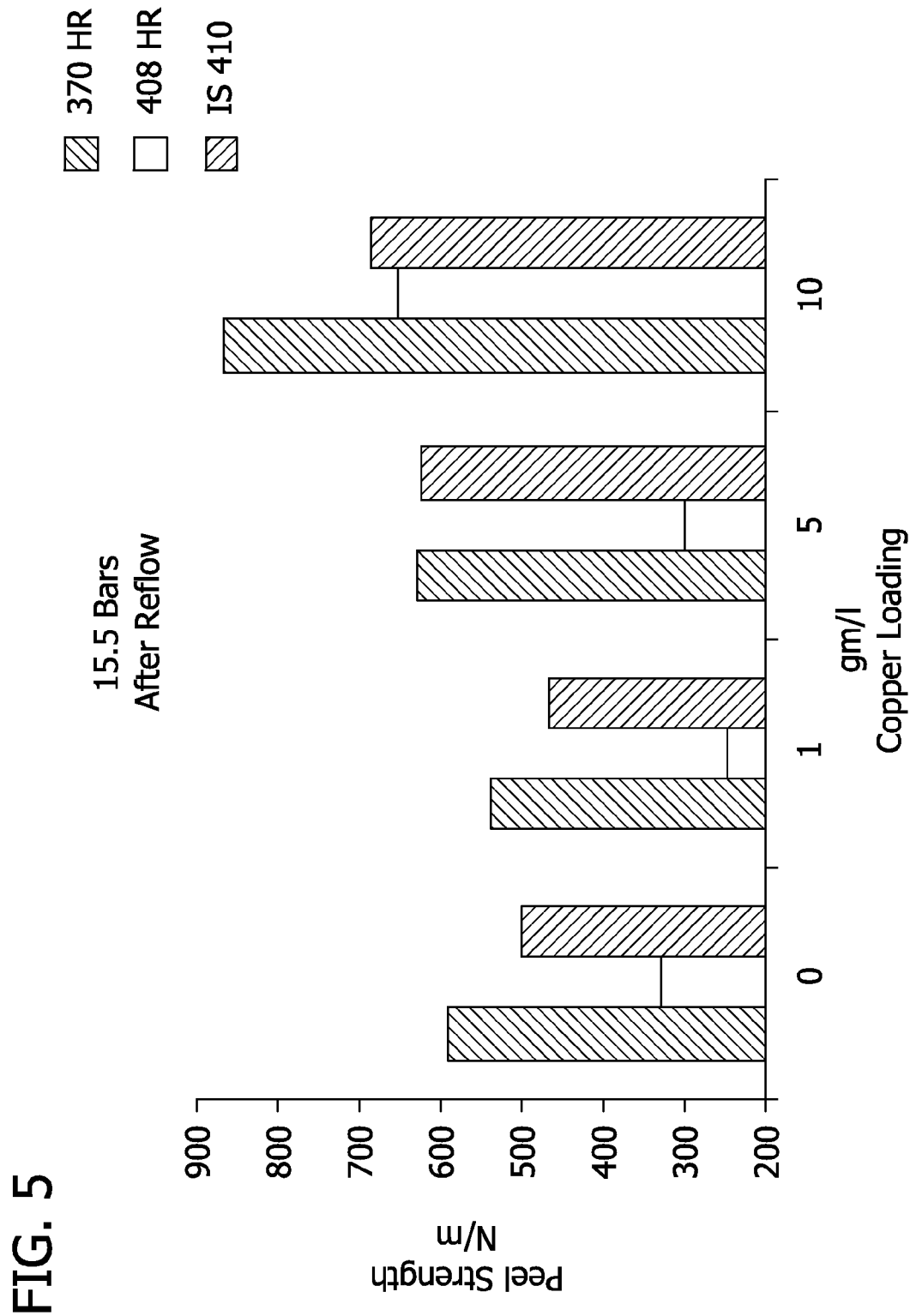
Figure 6:
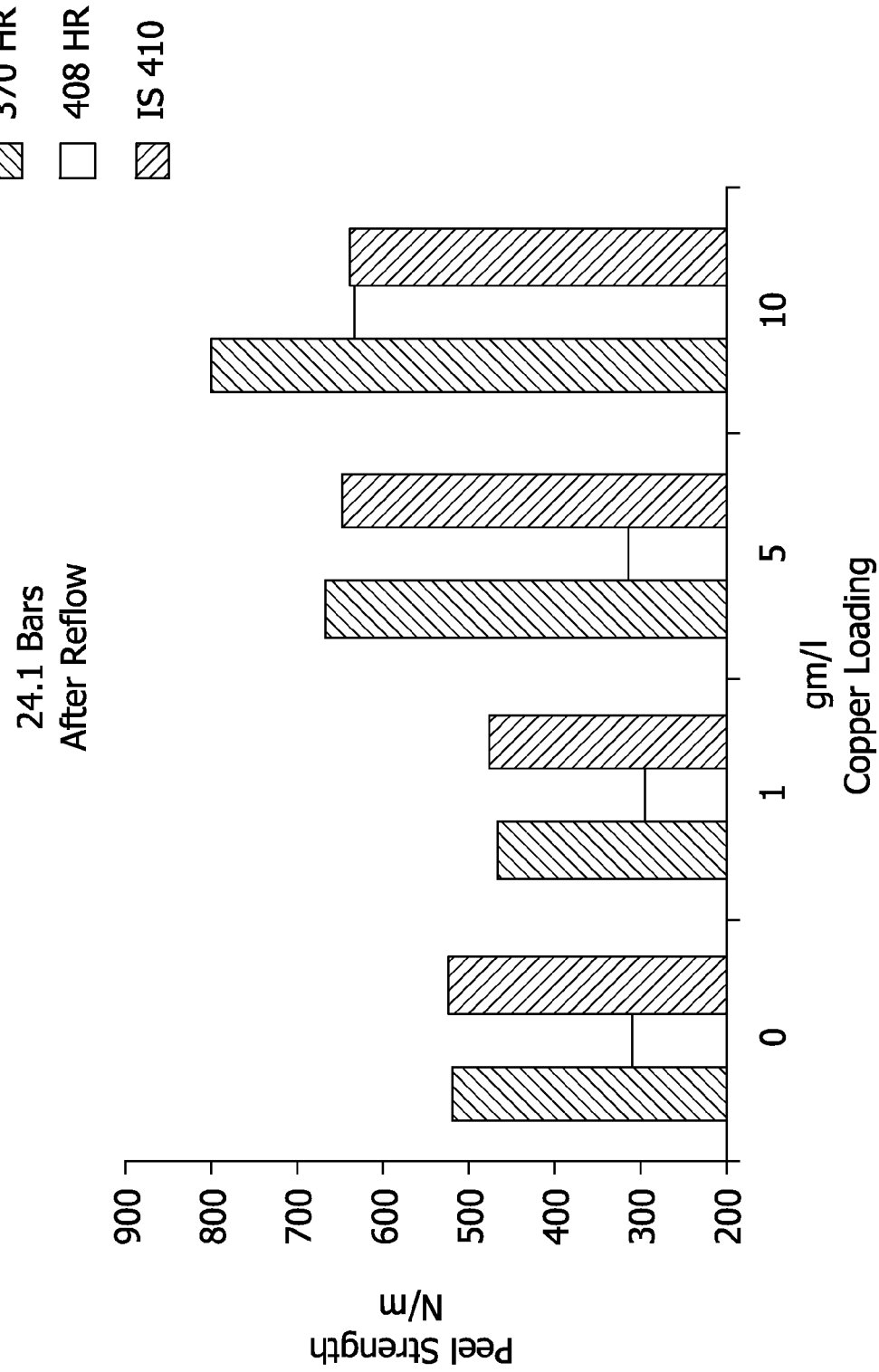

The average peel strengths for composites comprising the three different dielectrics are depicted in FIG. 3 for laminates prepared at 15.5 bar and tested before reflow, in FIG. 4 for laminates prepared at 24.1 bar and tested before reflow, in FIG. 5 for laminates prepared at 15.5 bar and tested after reflow, and in FIG. 6 for laminates prepared at 24.1 bar and tested after reflow.

Example 20

Another series of tests were conducted in the manner described in Example 19 except that, in one series of tests, the adhesion promoting solution was doped with 1 g/l of Conditioner #2, while in the other the adhesion promoting solution of Example 16 was used without adulteration.

The average peel strengths for composites comprising the three different dielectric for laminates prepared at 15.5 bar and 24.1 bars, respectively, after treatment with an adhesion promoting solution of Example 16 with no addition of conditioner #2 are displayed in FIGS. 7 and 8 while the peel strengths for composites prepared at 15.5 and 24.1 bars, respectively, after treatment with an adhesion promoting solution that had been doped with ~1 g/l of Conditioner #2 are depicted in FIGS. 9 and 10.

Example 21

Another series of tests were conducted generally in the manner described in Example 17. Five different substrates were used, including 370 HR, 408 HR, IS 410, Pan R-1556, and Nanya NPG 170 LT. The adhesion promoting solution was doped with copper ions in a concentration of 5 g/l and with varying proportions of conditioner #2, ranging from 0 to 10 g/l. Lamination was effected at a pressure of 15.5 bars.

The average peel strengths obtained were as depicted in FIG. 11.

Example 22

Two additional series of tests were conducted substantially in the manner described in Example 18, except that the adhesion promoting solution was doped with a substantially broader and higher range of concentrations of copper ions, i.e., 0, 1, 10, 40 and 50 g/l. Each run was conducted using Conditioner #2 followed by the adhesion promoting solution of Example 16. The adhesion promoting solution was not doped with any addition of Conditioner.

The peel test results of the tests of this Example are depicted as bar graphs in FIGS. 12 and 13.

Example 23

Additional tests were run generally in the manner described in Example 18. Conditioner #2 was used, followed by the adhesion promoting solution of Example 16. Both the conditioner and the adhesion promoting solution were doped with copper ions in a concentration of 40 g/l. The dwell time between application of the conditioner and application of the adhesion promoting solution was varied.

The peel test results of this Example are depicted in the bar graphs of FIG. 14. "Hang time" refers to the time required to remove the bulk of the water film adhering to the coupons after treatment with the conditioner. "Cool Dry" refers to cool dry time subsequent to removal of the water film.

Example 24

Additional experimental runs were conducted generally in the manner described in Example 21 except that the copper ion concentration in the adhesion promoting formulations was 10 g/l and only dielectric substrates 370 HR, 408 HR and IS 410 were tested.

Peel strength results are depicted in FIGS. 15 and 16.

In view of the above, it will be seen that the several objects of the invention are achieved and other advantageous results attained.

When introducing elements of the present invention or the preferred embodiments(s) thereof, the articles "a", "an", "the" and "said" are intended to mean that there are one or more of the elements. The terms "comprising", "including"

and "having" are intended to be inclusive and mean that there may be additional elements other than the listed elements.

As various changes could be made in the above compositions and processes without departing from the scope of the invention, it is intended that all matter contained in the above description and shown in the accompanying drawings shall be interpreted as illustrative and not in a limiting sense.

What is claimed is:

1. A method for enhancing adhesion between a copper conducting layer and a dielectric material during manufacture of a printed circuit board, the method comprising:
   contacting the copper conducting layer with an alkaline conditioning composition, said conditioning composition having a pH between about 10 and about 15 and comprising a functional organic compound and a transition metal ion, said functional organic compound forming a self-assembled monolayer on a copper surface and being selected from the group consisting of nitrogen-containing aromatic heterocyclic compounds, arylamines, aralkylamines, fatty amines, sulfur-bearing aromatic heterocyclic compounds, aryl thiols, aralkyl thiols, and combinations thereof; and
   thereafter contacting the copper conducting layer with an adhesion promoting composition that comprises an oxidizing agent, an inorganic acid, and a corrosion inhibitor.

2. A method as set forth in claim 1 wherein said transition metal ion is selected from the group consisting of zinc, nickel, cobalt, copper, silver, gold, palladium and other platinum group metals.

3. A method as set forth in claim 2 wherein said transition metal ion comprises zinc.

4. A method as set forth in claim 3 wherein Zn is present in said conditioning composition in the form of $Zn^{2+}$, $Zn^{2+}$/ammonia complex, zinc oxide, $ZnO_2^=$ or combinations thereof.

5. A method as set forth in claim 1 wherein the alkaline conditioning solution contains a base selected from the group consisting of an alkali metal hydroxide, an alkali metal carbonate, and an alkylamine.

6. A method as set forth in claim 1 wherein said transition metal comprises copper.

7. A process as set forth claim 1 wherein said copper conducting layer is rinsed with water after contact with said alkaline conditioning agent and before contact with said adhesion promoting composition.

8. A process as set forth in claim 1 wherein said alkaline conditioning composition comprises a base selected from the group consisting of an alkali metal hydroxide, an alkali metal carbonate, an alkylamine, and combinations thereof, said transition metal is selected from the group consisting of zinc, nickel, cobalt, copper, silver, gold, palladium and other platinum group metals, and said functional organic compound comprises purine or a derivative of purine corresponding to formula I:

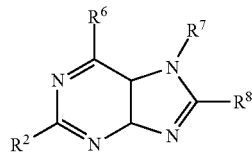

(Formula I)

wherein each of $R^2$, $R^6$, and $R^8$ is independently selected from the group consisting of hydrogen, hydrocarbyl, substituted hydrocarbyl, hydroxycarbonyl, alkoxycarbonyl, alkoxy, hydroxyl, sulfhydryl, halo, nitro, cyano and $NR^9R^{10}$, $R^7$ is selected from the group consisting of hydrogen, hydrocarbyl, substituted hydrocarbyl, hydroxyl, or a negative charge, and each of $R^9$ and $R^{10}$ is independently selected from the group consisting of hydrogen, hydrocarbyl and substituted hydrocarbyl.

9. A method as set forth in claim 2 wherein said transition metal is selected from the group consisting of zinc, nickel, copper cobalt, silver, gold, palladium and other platinum group metals.

10. A method as set forth in claim 9 wherein said functional organic compound is selected from the group consisting of arylamines, aryl thiols, aralkyl thiols, aromatic sulfur-containing heterocycles.

11. A method as set forth in claim 10 wherein said functional organic compound is selected from the group consisting of aniline, aniline derivatives, toluidine, toluidine derivatives, benzothiazoles, thiophene, thiophene derivatives, benzothiophene, and benzothiophene derivatives.

12. A method as set forth in claim 9 wherein said functional organic compound comprises a nitrogen-containing aromatic heterocyclic compound comprising a ring

group or an amine substituent on the ring wherein $R^7$ is hydrogen, hydrocarbyl or substituted hydrocarbyl, hydroxyl or a negative charge.

13. A method as set forth in claim 12 wherein said nitrogen-containing heterocyclic compound comprises both a ring

group and an amine substituent on the ring.

14. A method as set forth in claim 12 wherein said nitrogen containing aromatic heterocyclic compound comprises a compound selected from the group consisting of mercaptobenzimidazoles, mercaptobenzothiazoles, and mercaptobenzotriazoles.

15. A method as set forth in claim 9 wherein said conditioning composition comprises purine or a purine derivative.

16. A method as set forth in claim 15 wherein said nitrogen-containing aromatic heterocyclic compound corresponds to the formula:

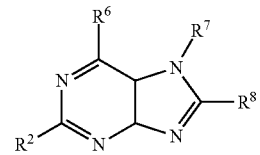

(Formula I)

wherein each of $R^2$, $R^6$, and $R^8$ is independently selected from the group consisting of hydrogen, hydrocarbyl, substituted hydrocarbyl, hydroxycarbonyl, alkylcarbonyl alkoxycarbonyl, alkoxy, alkenoxy, hydroxyl, hydroxyalkyl, hydroxyalkenyl, sulfhydryl, halo, nitro, cyano and $NR^9R^{10}$, $R^7$ is selected from the group consisting of hydrogen, hydrocarbyl, substituted hydrocarbyl, hydroxyl, or a negative charge, and each of $R^9$ and $R^{10}$ is independently selected from the group consisting of hydrogen, hydrocarbyl and substituted hydrocarbyl.

17. A method as set forth in claim 16 wherein said purine derivative is substituted with a functional group selected from the group consisting of substituted or unsubstituted vinyloxy, substituted or unsubstituted amide, substituted or unsubstituted amine, hydroxycarbonyl, substituted or unsubstituted alkoxycarbonyl, hydroxyalkyl, hydroxyalkenyl, substituted or unsubstituted silyl, and substituted or unsubstituted alkoxysilyl.

18. A method as set forth in claim 12 wherein said nitrogen-containing aromatic heterocyclic compound has the structure (Ia) or structure (Ib):

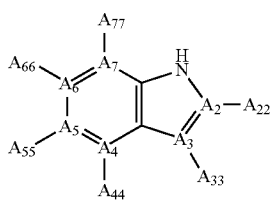

(Ia)

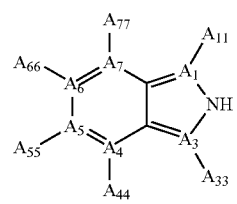

(Ib)

wherein:
$A_1, A_2, A_3, A_4, A_5, A_6$, and $A_7$ are carbon atoms or nitrogen atoms and the sum of nitrogen atoms from $A_1, A_2, A_3, A_4, A_5, A_6$, and $A_7$ is 0, 1, 2, or 3;

$A_{11}, A_{22}, A_{33}, A_{44}, A_{55}, A_{66}$, and $A_{77}$ are selected from the group consisting of electron pair, hydrogen, substituted or unsubstituted alkyl, substituted or unsubstituted aryl, substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubstituted silane or alkoxysilane; and at least one of $A_{11}, A_{22}, A_{33}, A_{44}$, and $A_{55}$ is selected from the group consisting of substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubsituted silane or alkoxysilane.

19. A method as set forth in claim 18 wherein the nitrogen-containing aromatic heterocyclic compound correspond to structure (II), structure (III), or structure (IV):

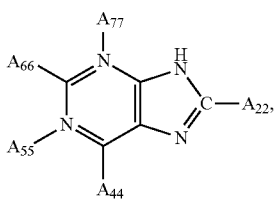

(II)

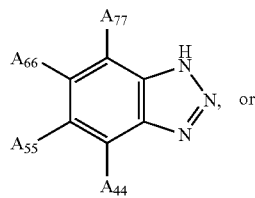

(III)

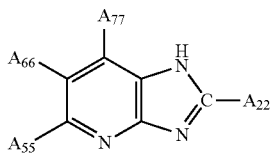

(IV)

wherein $A_{22}, A_{44}, A_{55}, A_{66}$, and $A_{77}$ are as defined in connection with structures (Ia) and (Ib).

20. A method as set forth in claim 12 wherein said nitrogen-containing aromatic heterocyclic compound has the structure (V):

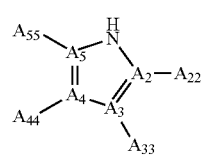

(V)

wherein:
$A_2, A_3, A_4$ and $A_5$ are carbon atoms or nitrogen atoms and the sum of nitrogen atoms from $A_2, A_3, A_4$ and $A_5$ is 0, 1 or 2;

$A_{22}, A_{33}, A_{44}$, and $A_{55}$ are selected from the group consisting of hydrogen, substituted or unsubstituted alkyl, substituted or unsubstituted aryl, substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubsituted silane or alkoxysilane; and at least one of $A_{22}, A_{33}, A_{44}$, and $A_{55}$ is selected from the group consisting of substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubsituted silane or alkoxysilane.

21. A method as set forth in claim 9 wherein said adhesion promoting composition further comprises a transition metal ion.

22. A method as set forth in claim 21 wherein said adhesion promoting solution comprises a transition metal ion selected from the group consisting of zinc, nickel, cobalt, silver, gold, palladium and other platinum group metals.

23. A method as set forth in claim 22 wherein said adhesion promoting composition comprises a zinc ion.

24. A method as set forth in claim 12 wherein said corrosion inhibitor comprises a nitrogen-containing aromatic heterocyclic compound comprising a ring

group or an amine substituent on the ring wherein $R^7$ is hydrogen, hydrocarbyl or substituted hydrocarbyl.

25. A method as set forth in claim 24 wherein said heterocyclic compound comprises both a ring

group and an amine substituent on the ring.

26. A method as set forth in claim 24 wherein said nitrogen containing aromatic heterocyclic compound comprises a compound selected from the group consisting of mercaptobenzimidazoles, mercaptobenzothiazoles, and mercaptobenzotriazoles.

27. A method as set forth in claim 24 wherein said corrosion inhibitor has the structure (Ia) or structure (Ib):

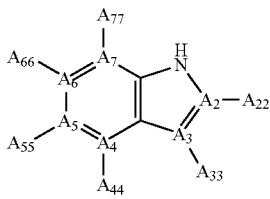

(Ia)

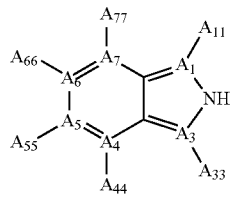

(Ib)

wherein:
$A_1, A_2, A_3, A_4, A_5, A_6,$ and $A_7$ are carbon atoms or nitrogen atoms and the sum of nitrogen atoms from $A_1, A_2, A_3, A_4, A_5, A_6,$ and $A_7$ is 0, 1, 2, or 3;
$A_{11}, A_{22}, A_{33}, A_{44}, A_{55}, A_{66},$ and $A_{77}$ are selected from the group consisting of electron pair, hydrogen, substituted or unsubstituted alkyl, substituted or unsubstituted aryl, substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubstituted silane or alkoxysilane; and
at least one of $A_{11}, A_{22}, A_{33}, A_{44},$ and $A_{55}$ is selected from the group consisting of substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubsituted silane or alkoxysilane.

28. A method as set forth in claim 27 wherein corrosion inhibitor corresponds to structure (II), structure (III), or structure (IV):

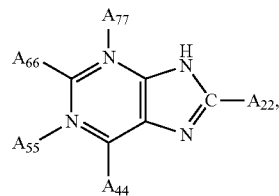

(II)

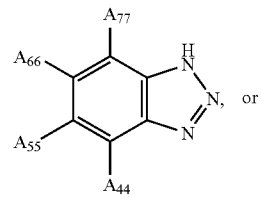

(III)

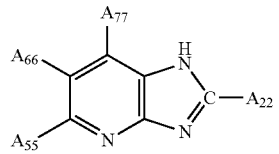

(IV)

wherein $A_{22}, A_{44}, A_{55}, A_{66},$ and $A_{77}$ are as defined in connection with structures (Ia) and (Ib).

29. A method as set forth claim 24 wherein said corrosion inhibitor has the structure (V):

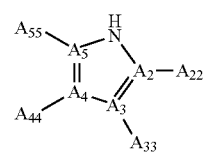

(V)

wherein:
$A_2, A_3, A_4$ and $A_5$ are carbon atoms or nitrogen atoms and the sum of nitrogen atoms from $A_2, A_3, A_4$ and $A_5$ is 0, 1 or 2;
$A_{22}, A_{33}, A_{44},$ and $A_{55}$ are selected from the group consisting of hydrogen, substituted or unsubstituted alkyl, substituted or unsubstituted aryl, substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubsituted silane or alkoxysilane; and
at least one of $A_{22}, A_{33}, A_{44},$ and $A_{55}$ is selected from the group consisting of substituted or unsubstituted vinyl ether, substituted or unsubstituted amide, substituted or unsubstituted amine, substituted or unsubstituted carboxylic acid, substituted or unsubstituted ester, substituted or unsubstituted alcohol, and substituted and unsubsituted silane or alkoxysilane.

30. A method as set forth in claim 24 wherein said corrosion inhibitor comprises purine or a purine derivative.

31. A method as set forth as set forth in claim 24 wherein said conditioning composition comprises purine or a purine derivative.

32. A method as set forth in claim 9 wherein the conditioning composition is substantially free of peroxide.

33. A method as set forth in claim 9 wherein said conditioning composition is substantially free of an oxidant.

34. A method as set forth in claim 9 wherein said conditioning composition comprises an aqueous solution having an oxidation potential not greater than about 0.2 volts.

35. A method as set forth in claim 9 wherein said conditioning composition comprises between about 0.1 and about 3 wt. % of a transition metal ion and between about 0.05 and about 2.5 wt. % of a nitrogen-containing aromatic heterocycle comprising a ring

group.

36. A method for preparing a copper conducting layer for adhesion to a dielectric material during manufacture of a printed circuit board, the method comprising:
   contacting the copper conducting layer with an alkaline conditioning composition having a pH between 10 and 15 and comprising a nitrogen-containing aromatic heterocyclic compound, an alkali metal iodide and a glycol ether, said a nitrogen-containing aromatic heterocyclic compound comprising a ring

group or an amine substituent on the ring wherein $R^7$ is hydrogen, hydrocarbyl, substituted hydrocarbyl, hydroxyl, or a negative charge, said heterocyclic compound forming a self-assembled monolayer on a copper surface.

37. A method as set forth in claim 36 wherein said conditioning composition comprises between about 0.04 and about 4 wt. % iodide ion, between about 0.5 and about 5 wt. % glycol ether, between about 0.05 and about 2.5 wt. % purine purine derivative.

38. A method as set forth in claim 36 wherein said conditioning composition further comprising an anionic surfactant.

39. A method as set forth in claim 8 wherein said conditioning solution has a pH between about 10 and 14 and further comprises chloride ion.

40. A method for enhancing adhesion between a copper conducting layer and a dielectric material during manufacture of a printed circuit board, the method comprising:
   contacting the copper conducting layer with an alkaline conditioning composition, said conditioning composition comprising a base, a functional organic compound, and a transition metal ion, said base being selected from the group consisting of an alkali metal hydroxide, an alkali metal carbonate, an alkylamine and mixtures thereof, said functional organic compound forming a self-assembled monolayer on a copper surface and being selected from the group consisting of nitrogen-containing aromatic heterocyclic compounds, arylamines, aralkylamines, fatty amines, sulfur-bearing aromatic heterocyclic compounds, aryl thiols, aralkyl thiols, and combinations thereof; and
   thereafter contacting the copper conducting layer with an adhesion promoting composition that comprises an oxidizing agent, an inorganic acid, and a corrosion inhibitor.

* * * * *